United States Patent
Yoshioka et al.

(10) Patent No.: US 8,854,243 B2
(45) Date of Patent: Oct. 7, 2014

(54) AD CONVERTER CIRCUIT AND AD CONVERSION METHOD

(71) Applicants: Fujitsu Limited, Kawasaki (JP); Fujitsu Semiconductor Limited, Kanagawa (JP)

(72) Inventors: Masato Yoshioka, Kawasaki (JP); Yanfei Chen, Yokohama (JP); Tatsuya Ide, Kasugai (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/869,770

(22) Filed: Apr. 24, 2013

(65) Prior Publication Data

US 2013/0321189 A1 Dec. 5, 2013

(30) Foreign Application Priority Data

May 31, 2012 (JP) ................. 2012-124578

(51) Int. Cl.
*H03M 1/12* (2006.01)
*H03M 1/14* (2006.01)
*H03M 1/38* (2006.01)
*H03M 1/46* (2006.01)
*H03M 1/54* (2006.01)

(52) U.S. Cl.
CPC ............... *H03M 1/38* (2013.01); *H03M 1/468* (2013.01); *H03M 1/54* (2013.01); *H03M 1/145* (2013.01)
USPC ........... 341/156; 341/172; 341/166; 341/155; 341/159

(58) Field of Classification Search
CPC ......... H03M 1/002; H03M 1/10; H03M 1/12; H03M 1/06; H03M 1/18; H03M 1/38; H03M 1/54; H03M 1/68; H03M 1/146; H03M 1/145; H03M 1/167; H03M 1/365; H03M 1/366; H03M 1/468; H03M 1/804
USPC .................. 341/122, 156, 155, 159, 166, 172
See application file for complete search history.

(56) References Cited

U.S. PATENT DOCUMENTS 6,037,890 A * 3/2000 Glass et al. .................... 341/159
6,121,913 A * 9/2000 Glass et al. .................... 341/159

(Continued)

FOREIGN PATENT DOCUMENTS

| JP | 02-272825 A | 11/1990 |
| JP | 2009-164914 A | 7/2009 |
| JP | 2011-040985 A | 2/2011 |
| JP | 2011-259208 A | 12/2011 |

*Primary Examiner* — Lam T Mai
(74) *Attorney, Agent, or Firm* — Arent Fox LLP

(57) ABSTRACT

A low-power and high-speed ADC includes: a successive approximation converter circuit configured to sequentially compare and coarsely convert the analog input signal voltage into a digital signal with a number of higher-order bits, and also to output a residual voltage; a fixed-quantity change time measurement converter circuit configured to finely convert the residual voltage into a digital signal with a number n of lower-order bits by changing the residual voltage at a fixed rate of change and by measuring the time until a predetermined value is reached; and an encoder circuit configured to generate a digital signal with the predetermined number of bits by combining the digital signal with the number of higher-order bits output from the successive approximation converter circuit and the digital signal with the number of lower-order bits output from the fixed-quantity change time measurement converter circuit.

8 Claims, 18 Drawing Sheets

(56) References Cited

U.S. PATENT DOCUMENTS

| | | |
|---|---|---|
| 6,686,865 B2 * | 2/2004 | Confalonieri et al. ........ 341/172 |
| 6,747,589 B2 * | 6/2004 | Srinivasan et al. ............ 341/172 |
| 6,778,124 B2 * | 8/2004 | Hashimoto et al. ........... 341/155 |
| 7,474,239 B2 * | 1/2009 | Su et al. ........................ 341/120 |
| 8,451,160 B1 * | 5/2013 | Zhou et al. .................... 341/161 |
| 8,471,751 B2 * | 6/2013 | Wang ............................. 341/156 |
| 8,638,252 B2 * | 1/2014 | Davoodabadi ................ 341/156 |
| 2009/0184857 A1 | 7/2009 | Furuta et al. |

* cited by examiner

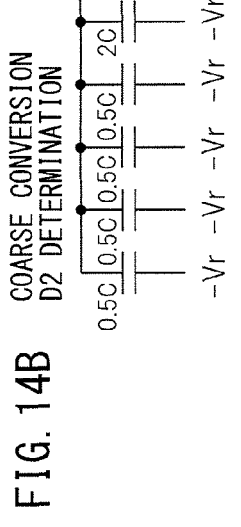
FIG. 14A INPUT SAMPLE
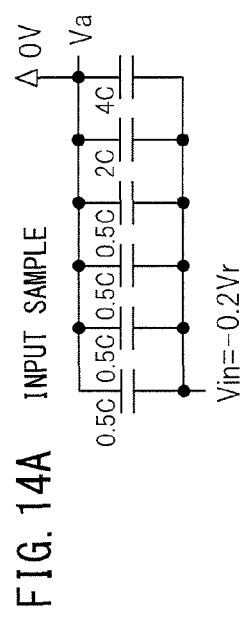
FIG. 14B COARSE CONVERSION D2 DETERMINATION
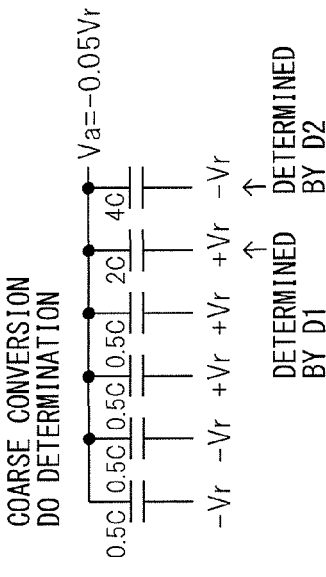
FIG. 14C COARSE CONVERSION D1 DETERMINATION
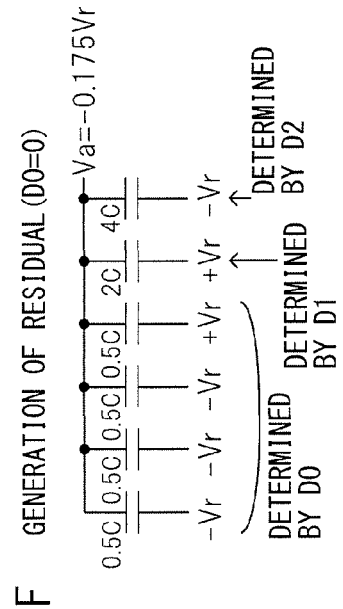
FIG. 14D COARSE CONVERSION D0 DETERMINATION
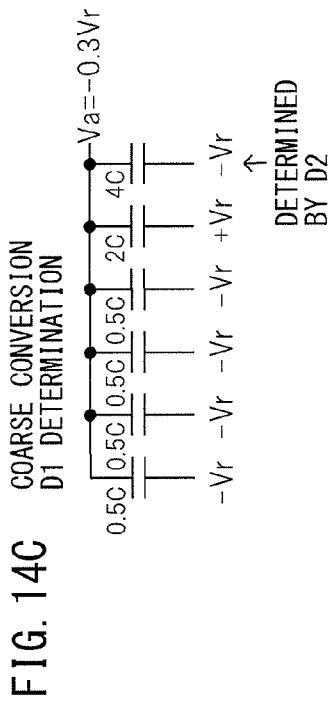
FIG. 14E GENERATION OF RESIDUAL (D0=1)
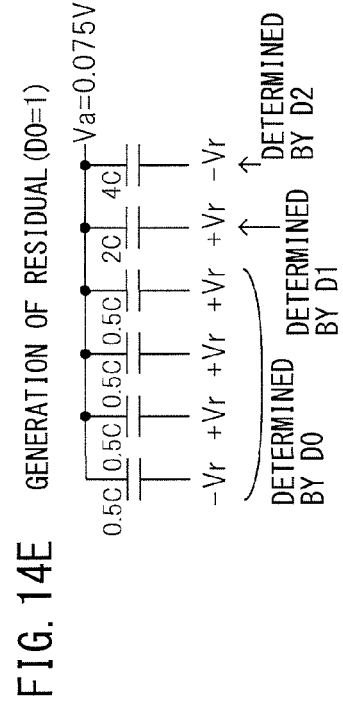
FIG. 14F GENERATION OF RESIDUAL (D0=0)

AD CONVERTER CIRCUIT AND AD CONVERSION METHOD

CROSS-REFERENCE TO RELATED APPLICATION

This application is based upon and claims the benefit of priority of the prior Japanese Patent Application No. 2012-124578, filed on May 31, 2012, the entire contents of which are incorporated herein by reference.

FIELD

The disclosed techniques relate to an analog-to-digital (AD) converter circuit and an analog-to-digital (AD) conversion method.

BACKGROUND

Various types of AD conversion systems are known, such as flash, successive approximation and pipeline, slope and follow-up, double integral (double slope type), VF conversion, and Delta Sigma. A successive approximation register analog-to-digital converter (SAR-ADC) is characterized in having a simple circuit configuration and low power consumption because no operational amplifier is necessary for analog signal processing. SAR-ADC is used widely in combination with a microcomputer etc.

SAR-ADC is implemented by a configuration that uses a digital-to-analog converter (DAC) that changes a current value, a configuration that utilizes a capacitive DAC (hereinafter, referred to as CDAC) having a plurality of sub capacitors the capacitance values of which change in a ratio of powers of 2, etc. In recent years, a configuration that utilizes CDAC is common and in the following explanation, the configuration that utilizes CDAC is explained as an example.

In a SAR-ADC that utilizes CDAC, an analog input signal is sampled by the CDAC and a charge amount corresponding to the voltage value of the analog input signal is held in the CDAC. The voltage value of the CDAC is compared with a reference potential by a comparator and the determination result is output, and in accordance with the determination result, reference voltages to be applied to the terminals of the sub capacitors forming the CDAC, i.e., bit values corresponding to the sub capacitors are determined so that the voltage value of the CDAC becomes close to the reference potential. The voltage of the CDAC having changed accompanying the determination of the sub capacitor is further compared by the comparator and a loop operation to cause a change so that voltage value of the CDAC further becomes close to the reference potential is repeated. By repeating the loop operation for the sub capacitors in the order from the sub capacitor having the largest capacitance value, the voltage of the CDAC asymptotically approaches the reference potential.

In the case of a k-bit ADC, (k+1) sub capacitors whose capacitance value ratio is $1:1:2:4: \ldots :2^{k-1}$ are provided and determination is performed sequentially in the order from the bit value corresponding to the sub capacitor having the largest capacitance value. That is, at the point of time when the determination of k bits is completed, a digital signal (data) indicating the digital level closest to the voltage value of the analog signal, i.e., indicating the voltage value at the $2^k$ interval for the full scale voltage is determined. A voltage difference between the actual voltage of the analog input signal and the voltage value indicated by the digital signal is referred to as a residual voltage and the range of the residual voltage is a so-called quantization error.

As described above, in the SAR-ADC, the loop operation for determination is repeated the number of times corresponding to the resolution of the ADC sequentially in the order from the loop operation for determination of the highest-order bit. For example, in the case where the resolution of the ADC is 12 bits (k=12), the determination loop is repeated 12 times. Due to this, AD conversion of the sampled analog input signal is completed.

In the SAR-ADC, the CDAC and the comparator are used repeatedly by the loop operation, and therefore, it is necessary to preserve the analog input signal once sampled as charges in the CDAC until the AD conversion of k bits is completed. Consequently, the conversion period of the SAR-ADC is the sum of the sampling time and the AD conversion time for k bits.

The AD conversion time is proportional to the number k of bits (resolution). That is, if the relatively short sampling time is ignored, the conversion speed, which is the inverse of the conversion period, is inversely proportional to the resolution k.

The SAR-ADC that uses the CDAC is characterized in having a simple circuit configuration and low power consumption because no operational amplifier is necessary for analog signal processing.

In recent years, improvement in conversion speed is demanded also for the SAR-ADC. By reducing the loop time for one-time loop operation, the conversion speed is expected to improve, however, there is a limit to this method in view of the response and settling time of the comparator and CDAC.

The SAR-ADC is implemented by a simple configuration and has an architecture excellent in low power consumption, however, there is a problem that if one of the resolution and conversion speed is increased, the other reduces inevitably.

RELATED DOCUMENTS

[Patent Document 1] Japanese Laid Open Patent Document No. 2009-164914
[Patent Document 2] Japanese Laid Open Patent Document No. 2011-040985
[Patent Document 3] Japanese Laid Open Patent Document No. H02-272825
[Patent Document 4] Japanese Laid Open Patent Document No. 2011-259208

SUMMARY

According to a first aspect of the embodiments, an analog-to-digital converter circuit configured to convert an analog input signal voltage into a digital signal with a predetermined number of bits, includes: a successive approximation converter circuit configured to sequentially compare and coarsely convert the analog input signal voltage into a digital signal with a number of higher-order bits, and also to output a residual voltage between the analog input signal voltage and an analog signal voltage corresponding to the digital signal with the number of higher-order bits; a fixed-quantity change time measurement converter circuit configured to finely convert the residual voltage into a digital signal with a number n of lower-order bits by changing the residual voltage at a fixed rate of change and by measuring the time until a predetermined value is reached; and an encoder circuit configured to generate a digital signal with the predetermined number of bits by combining the digital signal with the number of higher-order bits output from the successive approximation converter circuit and the digital signal with the number of lower-order bits output from the fixed-quantity change time measurement converter circuit.

According to a second aspect of the embodiments, an analog-to-digital conversion method for converting an analog input signal voltage into a digital signal with a predetermined number of bits, includes: sequentially comparing and coarsely converting the analog input signal voltage into a digital signal with a number of higher-order bits, and also outputting a residual voltage between the analog input signal voltage and an analog signal voltage corresponding to the digital signal with the number of higher-order bits; finely converting the residual voltage into a digital signal with a number of lower-order bits by changing the residual voltage at a fixed rate of change and by measuring the time until a predetermined value is reached; and generating a digital signal with the predetermined number of bits by combining the digital signal with the number of higher-order bits and the digital signal with the number of lower-order bits.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 13A an FIG. 13B are diagrams explaining the influence of the offset of the comparator in the first embodiment, wherein, FIG. 13A illustrates the case where the offset is zero and FIG. 13B illustrates the case where there is an offset of +0.5 LSB;

FIG. 14A to FIG. 14F are diagrams illustrating the configuration of sub capacitors of the CDAC of the ADC of the third embodiment and examples of voltages to be applied to each sub capacitor of the capacitive DAC in coarse conversion processing and in fine conversion processing and voltages at the common node;

FIG. 15A and FIG. 15B are diagrams illustrating examples of changes in the voltage Va in the coarse conversion processing and in the fine conversion processing explained in FIG. 14A to FIG. 14F, wherein FIG. 15A illustrates a case where the offset of the comparator is very small (offset=0 V) and FIG. 15B illustrates a case where the offset=−0.0625 Vr;

FIG. 17A and FIG. 17B are diagrams for explaining fine conversion processing in the case where the residual voltage is negative, wherein FIG. 17A is a diagram for explaining fine conversion processing and FIG. 17B illustrates a conversion example in the case where the offset of the comparator is 0 V;

FIG. 18A and FIG. 18B are diagrams for explaining fine conversion processing in the case where the residual voltage is positive, wherein FIG. 18A is a diagram explaining fine conversion processing and FIG. 18B illustrates a conversion example in the case where the offset of the comparator is 0 V; and FIG. 19A and FIG. 19B are diagrams for explaining the influence of the offset of the comparator in the third embodiment, wherein FIG. 19A illustrates a case where the offset is zero and FIG. 19B illustrates a case where there is an offset of +0.5 LSB.

DESCRIPTION OF EMBODIMENTS

Figure 1:
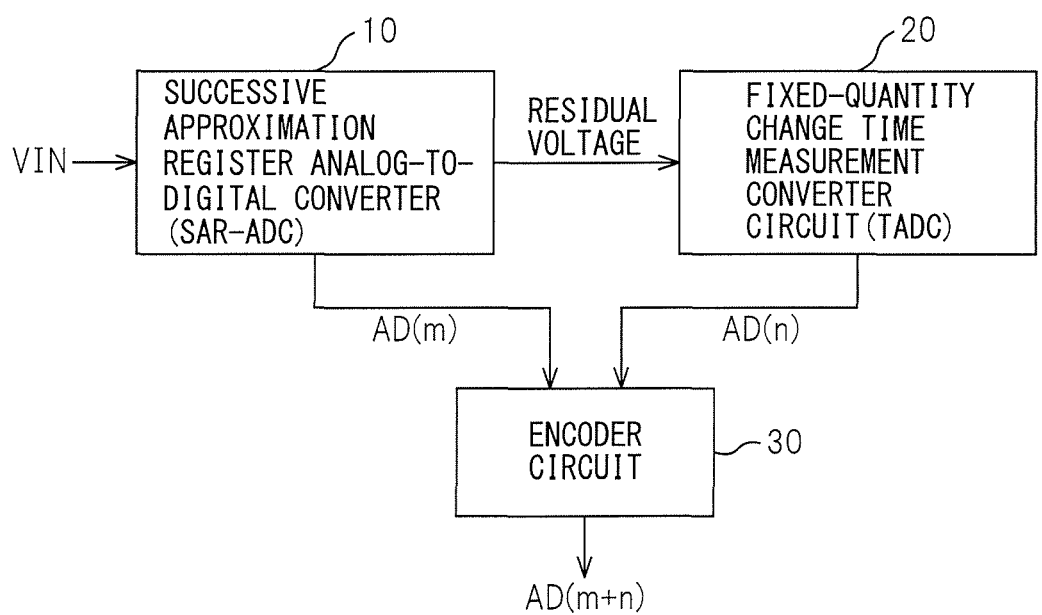
FIG. 1 is a diagram illustrating an outline of a configuration of an analog-to-digital (AD) converter circuit (hereinafter, referred to as ADC) of a first embodiment.

FIG. 1 is a diagram illustrating an outline of a configuration of an analog-to-digital (AD) converter circuit (hereinafter, referred to as ADC) of a first embodiment.

The ADC of the first embodiment has a successive approximation register analog-to-digital converter circuit (SAR-ADC) 10, a fixed-quantity change time measurement converter circuit (TADC) 20, and an encoder circuit 30. The SAR-ADC 10 sequentially compares analog input signal voltages VIN and coarsely converts them into an m-bit digital signal and also outputs a residual voltage between the analog input signal voltage and an analog signal voltage corresponding to the m-bit digital signal. The TADC 20 finely converts the residual voltage into an n-bit digital signal by changing the residual voltage at a fixed rate and measuring the time until a predetermined value is reached. The encoder circuit 30 takes the m-bit digital signal output from the SAR-ADC 10 to be higher-order bits and the n-bit digital signal output from the TADC 20 to be lower-order bits, and then combines both bits to generate an (m+n)-bit digital signal.

In other words, the ADC of the first embodiment divides AD conversion processing into m-bit coarse conversion processing and n-bit fine conversion processing. The coarse conversion processing needs to have a high precision in analog signal processing is performed by the SAR-ADC 10 and the fine conversion processing is performed by the TADC 20 capable of obtaining a comparatively high resolution in a brief time. When the coarse conversion processing is completed, the TADC 20 starts the fine conversion processing at a timing generated internally in an asynchronous manner with an external clock.

In the following explanation, a case where the SAR-ADC 10 has the CDAC is explained as an example, however, any successive approximation register converter circuit may be used as long as it is an AD converter circuit capable of performing AD conversion of higher-order bits and of outputting a residual voltage to the TADC 20.

In the TADC 20 to be explained below, a fixed amount of current is discharged from or charged to the capacitor charged with the residual voltage, the voltage of the capacitor is changed from the residual voltage at a fixed slope, and the time until a predetermined voltage level is reached is measured. This time is proportional to the residual voltage, and therefore, the residual voltage is converted into information of the time axis as a result. However, the method for converting the residual voltage into information of the time axis is not limited to this. For example, a voltage signal that changes from a predetermined voltage at a fixed slope is generated by discharging or charging a fixed amount of current from or to a capacitor, and by measuring the time until the voltage signal becomes equal to the residual voltage, the residual voltage is converted into information of the time axis. A circuit configured to generate a digital signal by converting a residual voltage into information of the time axis is referred to as a fixed-quantity change measurement converter circuit (TADC).

As the successive approximation register converter circuit (SAR-ADC) and the fixed-quantity change time measurement converter circuit (TADC), circuits of various kinds of system are known widely. It may also be possible to implement the SAR-ADC 10 and the TADC 20 in the first embodiment by applying those circuits appropriately.

Figure 2:
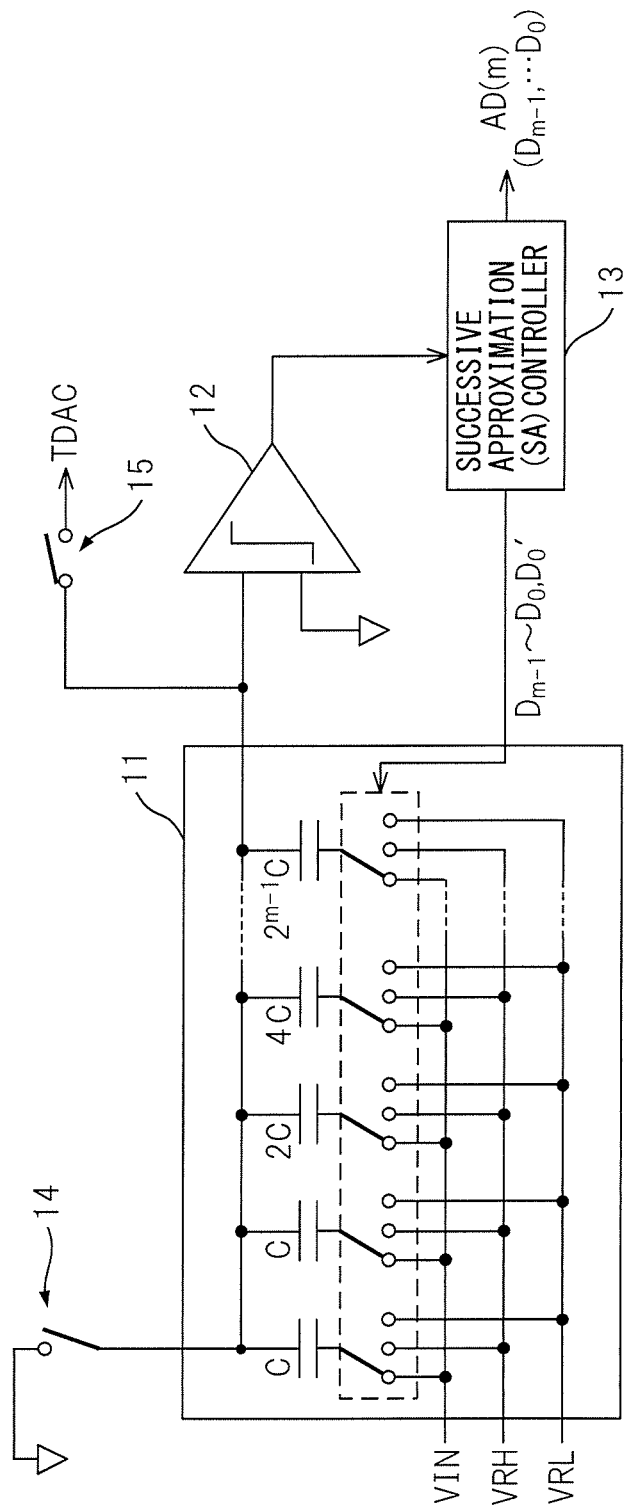
FIG. 2 is a diagram illustrating a configuration example of the SAR-ADC in the first embodiment.

FIG. 2 is a diagram illustrating a configuration example of the SAR-ADC 10 in the first embodiment.

The SAR-ADC 10 has a capacitive DAC 11, a comparator 12, a successive approximation (SA) controller 13, a switch 14, and a switch 15. The switch 14 connects the common node of the capacitive DAC 11 to a reference potential (here, 0 V). The switch 15 connects the common node of the capacitive DAC 11 to the TDAC 20.

The capacitive DAC 11 has (m+1) sub capacitors whose capacitance value ratio is $1:1:2:4: \ldots :2^{m-1}$. One terminal of each of the (m+1) sub capacitors is connected to the common node. The other terminal of each of the sub capacitors is connected to a switch configured to make connection so that one of the input signal VIN, a high-side reference voltage VRH, and a low-side reference voltage VRL is applied and connections of the group of the switches are controlled by the successive approximation controller 13. For example, VRH=+Vr and VRL=−Vr. The comparator 12 compares the voltage at the common node of the capacitive DAC 11 and the reference potential (0 V) and outputs the comparison result to the successive approximation controller 13. The successive approximation controller 13 samples input signals by controlling the connections of the switch group and further controls the connections of the switch group based on the comparison result of the comparator 12 so that the voltage at the common node becomes close to the reference potential. When the connections of the m sub capacitors in the switch group are determined, the m-bit coarse conversion processing in the SAR-ADC 10 is completed and the determined connected state of the m sub capacitors in the switch group is output as m-bit conversion data AD (m). Although not illustrated in FIG. 2, the successive approximation controller 13 also controls the connection of the switch 14.

Figure 3:
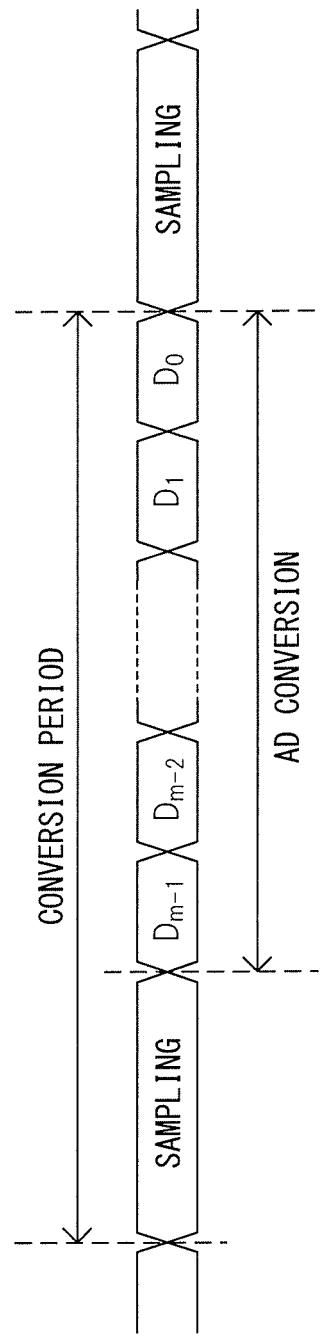
FIG. 3 is a time chart illustrating coarse conversion processing in the SAR-ADC.

FIG. 3 is a time chart illustrating coarse conversion processing in the SAR-ADC. In sampling, each of the switch group of the capacitive DAC 11 is connected so that VIN is applied and at the same time, the switch 14 is brought into the connected state and the switch 15 into the cutoff state. Due to this, a state is brought about where VIN is held in all the sub capacitors of the capacitive DAC 11.

The AD conversion processing includes m pieces of loop processing. In the first loop processing, after the switch 14 is changed into the cutoff state, switching is performed so that VRH is applied to the terminal of the sub capacitor having the largest capacitance value and VRL is applied to the terminals of the sub capacitors having the second largest capacitance value or smaller capacitance values. Due to this, at the common node of the capacitive DAC 11, the inverted voltage of the voltage VIN of the input signal is generated. The comparator 12 compares the voltage at the common node (here, the inverted voltage of the input voltage VIN) and the reference potential (0 V) and outputs the comparison result. In the case where the voltage at the common node is higher than the reference potential, the successive approximation controller 13 performs switching so that the terminal of the sub capacitor having the largest capacitance value is connected to VRL and in the case where the voltage at the common node is lower than the reference potential, the successive approximation controller 13 maintains the state where the terminal of the sub capacitor having the largest capacitance value is connected to VRH. After this, the connected state of the terminal of the sub capacitor having the largest capacitance value is maintained and this connected state corresponds to a value Dm−1 of the most significant bit.

Next, switching is performed so that VRH is applied to the terminal of the sub capacitor having the second largest capacitance value and VRL is applied to the terminals of the sub capacitors having the third largest capacitance value or smaller capacitance values. Due to this, at the common node of the capacitive DAC 11, the inverted voltage of the voltage VIN of the input signal to which VRH/2 or VRL/2 is added is generated. In other words, at the common node, a voltage of the inverted voltage of the voltage VIN of the input signal ±Vr/2 is generated. In the same manner as that described above, a value Dm-2 of the second bit is determined based on the comparison result of the comparator 12. By repeating the same operation, the voltage at the common node asymptotically becomes close to the reference potential (0 V) and a value D0 of the least significant bit (LSB) corresponding to the sub capacitor having the smallest capacitance value is determined, and then, the AD conversion processing is completed. After the AD conversion processing is completed, the same operation is repeated for an analog input signal at the time of the next sampling. At the point of time when the value D0 of the least significant bit is determined, an m-bit digital signal closest to the analog input signal is determined and the voltage at the common node becomes a difference voltage between the voltages corresponding to the analog input signal and the m-bit digital signal. This difference voltage is the residual voltage.

Figure 4:
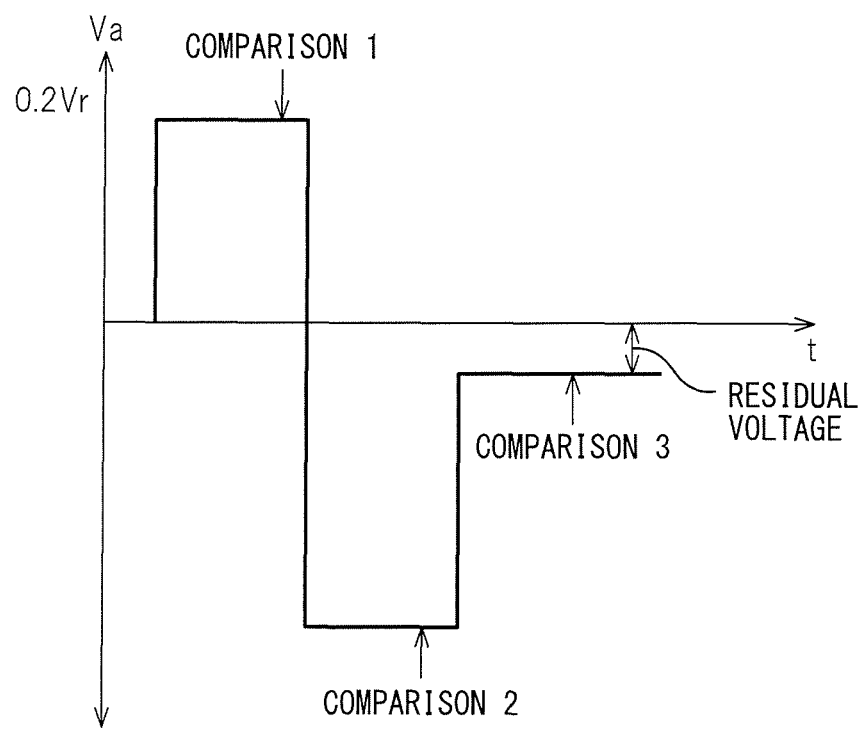
FIG. 4 is a diagram illustrating an example of a change in the voltage at the common node in coarse conversion processing in the SAR-ADC in the case where m is take to be 3 (m=3)

FIG. 4 is a diagram illustrating an example of a change in the voltage at the common node in coarse conversion processing in the SAR-ADC 10 in the case where m is take to be 3 (m=3).

FIG. 5A to FIG. 5D are diagrams each illustrating an example of voltages to be applied to the respective sub capacitors and a voltage at the common node of the capacitive DAC 11 in the coarse conversion processing of the SAR-ADC 10 in the case of the change in the voltage at the common node of FIG. 4.

With reference to FIG. 4 and FIG. 5, coarse conversion processing of the SAR-ADC 10 is explained in detail.

It is assumed that VRH=Vr and VRL=−Vr. That is, it is assumed that the full scale of AD conversion processing is 2 Vr.

Figure 5A:
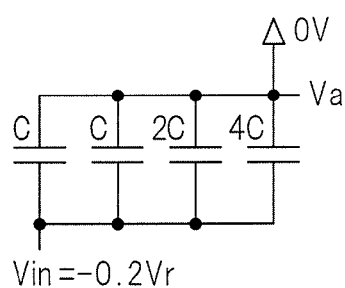
FIG. 5A to FIG. 5D are diagrams each illustrating an example of voltages to be applied to the respective sub capacitors and a voltage at the common node of the capacitive DAC in the coarse conversion processing of the SAR-ADC in the case of the change in the voltage at the common node of FIG. 4.
Figure 5B:
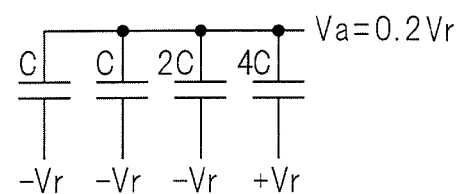

As illustrated in FIG. 5A, each of the switch group of the capacitive DAC 11 is connected so that a voltage Vin of the input signal is applied and at the same time, the switch 14 is brought into the connected state. Due to this, a state where Vin is held in all the sub capacitors of the capacitive DAC 11, i.e., a state where the voltage VIN of the input signal is sampled is brought about. It is assumed that Vin=−0.2 Vr.

After the switch 14 is changed into the cutoff state, switching is performed so that +Vr is applied to the terminal of a sub capacitor 4C having the largest capacitance value and −Vr is applied to the terminals of sub capacitors C, C, and 2C having the second largest capacitance value or smaller capacitance values. Due to this, a voltage Va at the common node of the capacitive DAC 11 becomes equal to −Vin=0.2 Vr (Va=−Vin=0.2 Vr). Due to this, as illustrated in FIG. 4, a state where the highest-order bit D2 of coarse conversion is determined is created and the first comparison is performed.

Figure 5C:
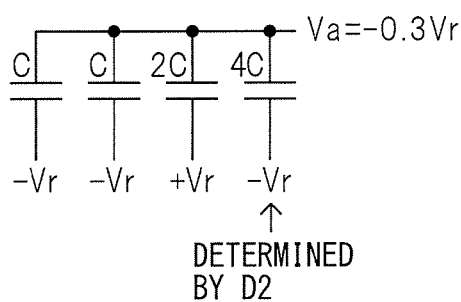

The comparator 12 compares Va (0.2 Vr) and the reference potential (0 V) and outputs the comparison result. In this case, Va is higher than 0 V, and therefore, the comparison result will be D2=1 (positive). Because D2=1, the successive approximation controller 13 changes the voltage to be applied to the other terminal of the capacitor 4C to −Vr and connects the voltage to be applied to the other terminal of the capacitor 2C to +Vr. Due to this, as illustrated in FIG. 5C, Va becomes equal to −Vin−0.5 Vr=−0.3 Vr (Va=−Vin−0.5 Vr=−0.3 Vr). Due to this, as illustrated in FIG. 4, a state to determine the bit D1 is created and the second comparison is performed.

Figure 5D:
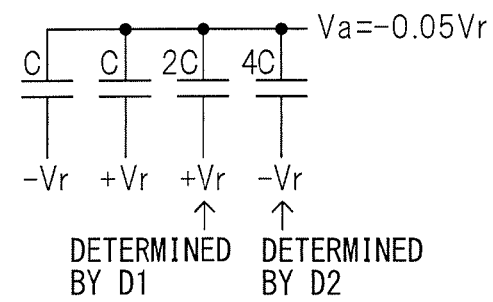

The comparator 12 compares Va (−0.3 Vr) and the reference potential (0 V) and outputs the comparison result. In this case, Va is lower than 0 V, and therefore, the comparison result will be D1=0 (negative). Because D1=0, the successive approximation controller 13 keeps the voltage to be applied to the other terminal of the capacitor 2C at +Vr, changes the voltage to be applied to the other terminal of one of the capacitors C to +Vr, and changes the voltage to be applied to the other terminal of the other capacitor C to −Vr. Due to this, as illustrated in FIG. 5D, Va becomes equal to −Vin−0.5 Vr+0.25 Vr=−0.05 Vr (Va=−Vin−0.5 Vr+0.25 Vr=−0.05 Vr). Due to this, as illustrated in FIG. 4, a state to determine the bit D0 is created and the third comparison is performed.

The comparator 12 compares Va (−0.05 Vr) and the reference potential (0 V) and outputs the comparison result. In this case, Va is lower than 0 V, and therefore, the comparison result will be D0=0 (negative). Then, the coarse conversion processing is completed. The 3-bit digital signal (code) of the coarse conversion will be 011 (although the result of the comparator is 100, all the bits are inverted by the encoder because the analog input is inverted when viewed from Va by the behavior of the capacitive DAC).

Va at the point of time when the coarse conversion processing is completed is the residual voltage and before fine conversion processing is started, the switch 15 is connected and the capacitors of the CDAC 11 are connected to TDAC 20.

Figure 6A:
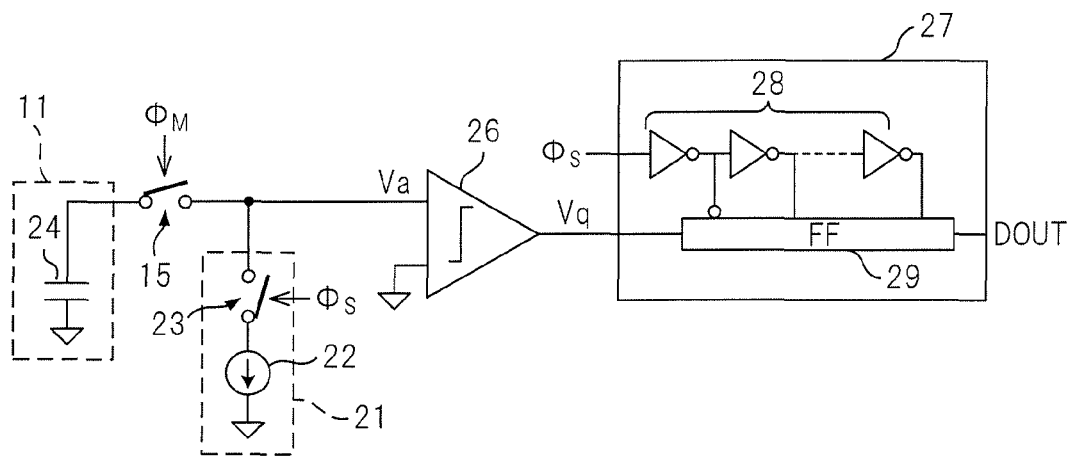
FIG. 6A is a diagram illustrating an outline of a configuration of the TADC of the first embodiment.
Figure 6B:
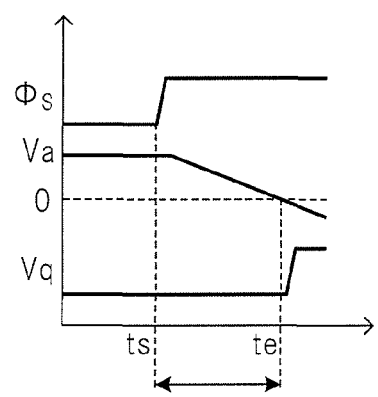
FIG. 6B is a time chart illustrating the operation of the TADC of FIG. 6A.

FIG. 6A is a diagram illustrating an outline of a configuration of the TADC 20 of the first embodiment and FIG. 6B is a time chart illustrating the operation of the TADC 20 of FIG. 6A.

As illustrated in FIG. 6A, the TADC 20 has a voltage-to-time converter 21, a zero cross detector (ZCD) 26, and a time-to-digital converter (TDC) 27.

The voltage-to-time converter 21 has a fixed current source 22 and a switch 23 configured to connect the switch 15 and the fixed current source 22. In FIG. 6A, a capacitor of the CDAC 11 of the SAR-ADC 10 is represented by reference symbol 24. One terminal of the capacitor 24 is connected to the input terminal of the ZCD 26 and the switch 23 via the switch 15.

As illustrated in FIG. 6B, when the switch 23 is connected in response to a signal Φs, the fixed current source 22 discharges a fixed amount of current from the capacitor 24 of the CDAC 11 or charges a fixed amount of current. FIG. 6B illustrates the case of discharge. Due to this, the voltage Va of the capacitor 24 of the CDAC 11 changes at a fixed slope.

Figure 7:
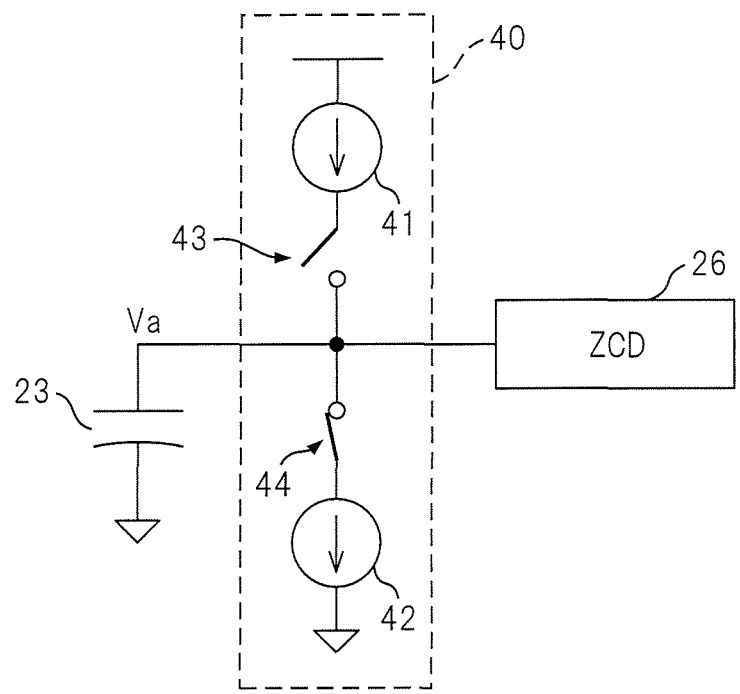
FIG. 7 is a diagram illustrating a detailed configuration of a section including a fixed current source and a switch, illustrating a capacitor and a zero cross detector (ZCD) together.

FIG. 7 is a diagram illustrating a detailed configuration of a section 40 including the fixed current source 22 and the switch 23, illustrating the capacitor 24 and the zero cross detector (ZCD) 26 together.

As described previously, the residual voltage of the capacitor 24 of the CDAC 11 may be positive (plus) or negative (minus) with respect to 0 V. In order to perform analog-to-digital conversion of the residual voltage, it is necessary to discharge the capacitor 24 when the residual voltage is positive or to charge the capacitor 24 when the residual voltage is negative. Because of this, when the final determination result in the SAR-ADC 10 is positive (1), the capacitor 24 is discharged and when negative (0), the capacitor 24 is charged.

To do this, the fixed current source 22 has a fixed current source 41 for charge and a fixed current source 42 for discharge. The switch 23 has a switch 43 configured to connect the fixed current source 41 for charge to the terminal of the capacitor 23 and a switch 44 configured to connect the fixed current source 42 for discharge to the terminal of the capacitor 23. The switches 43 and 44 are controlled by a timing generation circuit of the TADC 20, to be described later. Specifically, when the final determination result in the SAR-ADC 10 is 1, the switch 44 is connected and when the final determination result in the SAR-ADC 10 is 0, the switch 43 is connected.

The zero cross detector 26 outputs a detection signal Vq when detecting that the voltage Va, which is formed in the comparator and which changes at a fixed slope, reaches a predetermined potential (here, 0 V).

As illustrated in FIG. 6A, the time-to-digital converter (TDC) 27 has an inverter string 28 in which a plurality of inverters is connected in series and a flip-flop string (FF) 29 configured to latch the output in each stage of the inverter string. The FF 29 latches the output of the inverter string 28 in response to the detection signal Vq from the zero cross detector 26, that is, when the voltage Va reaches 0 V. The inverter string 28 delays the signal Φs and by detecting a position at which the signal latched by the FF 29 changes from L to H, a time when the signal Φs turns to H (=ts), i.e., when the discharge of Va is started, and a time (=te) when Va reaches 0 V are detected. The difference between te and ts, i.e., te−ts is proportional to the residual voltage, and therefore, digital data of the residual voltage will become clear.

In the TDC 27, the delay time corresponding to one inverter stage is the minimum detection time and the amount of change in Va during the minimum detection time is the minimum detection voltage. In order to perform n-bit fine conversion processing, $2^n$ inverters are connected in series, and therefore, the conversion time will be gate delay time×$2^n$ at the maximum. The gate delay time is, for example, several tens of picoseconds and the finer the process, the shorter the delay time is. For example, if the gate delay time is taken to be 10 ps and n to be 7, the time taken for conversion will be 10 ps×2⁷=1.28 ns at the maximum.

On the other hand, it takes about 1 ns for the SAR-ADC 10 to perform one loop because of the time for the operation of the comparator 12 and the successive approximation controller 13, and therefore, 7-bit conversion requires 7 ns. That is, with the ADC of the first embodiment, it is possible to operate the ADC with the same resolution at higher speed compared to the case of the SAR-ADC alone.

Further, the circuit of the TADC 20 has a very simple configuration and it is possible to suppress an increase in power to a smaller value compared to the case where the ADC with the same number of bits is implemented by the SAR-ADC 10 alone.

However, as the number of bits increases, the number of inverters of the TDC 27 increases exponentially and the circuit scale and the maximum conversion time also increase rapidly. Because of this, the relationship between the number m of bits to be determined by coarse conversion of the SAR-ADC 10 and the number n of bits to be determined by fine conversion of the TADC 20 is set appropriately in accordance with the specifications of the ADC.

Figure 8:
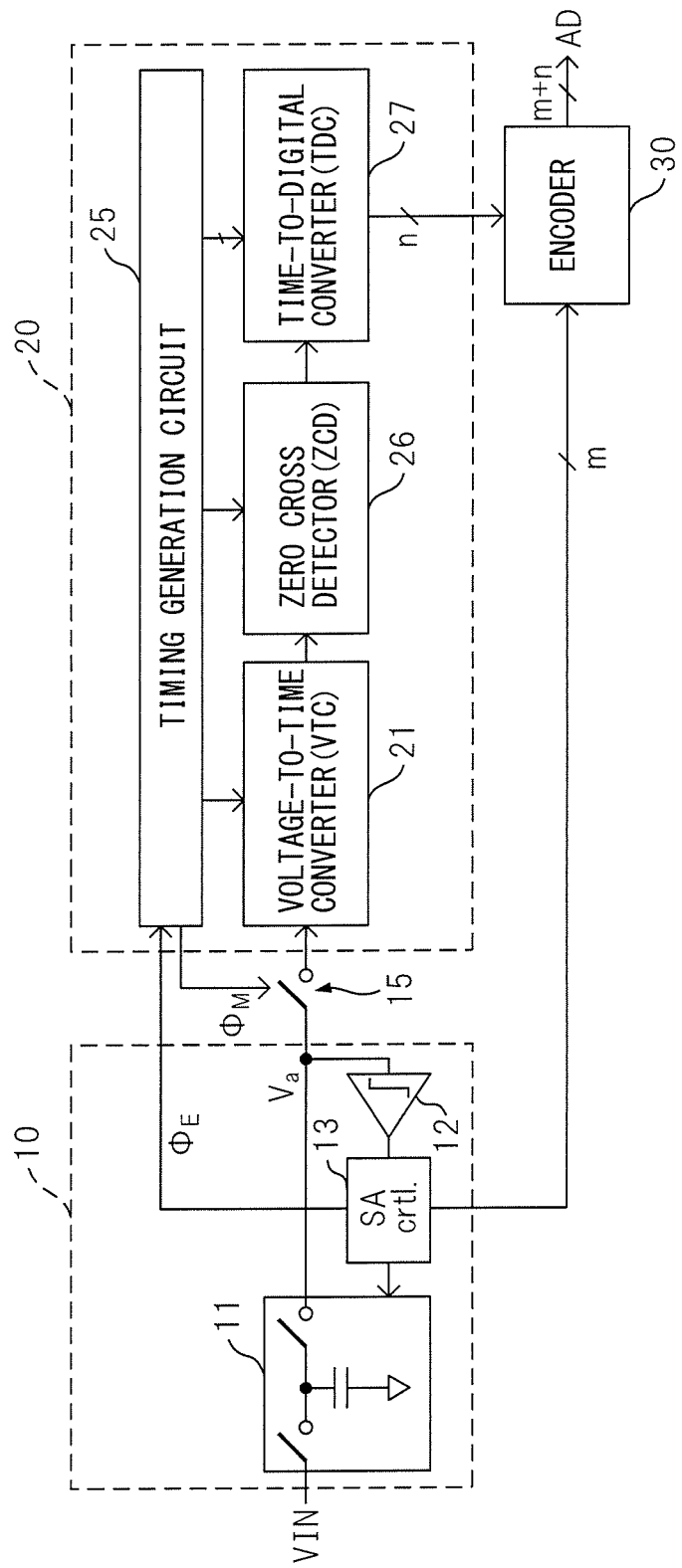
FIG. 8 is a diagram illustrating an outline of a configuration of the ADC of the first embodiment.

FIG. 8 is a diagram illustrating an outline of a configuration of the ADC of the first embodiment, in which the configuration of the successive approximation register analog-to-digital converter circuit (SAR-ADC) 10 and that of the fixed-quantity change time measurement analog-to-digital converter circuit (TADC) 20 in FIG. 1 are illustrated in detail in accordance with the explanation given above.

As described previously, the SAR-ADC 10 has the CDAC 11, the comparator 12, and the successive approximation (SA) controller 13. The CDAC 11 is simply illustrated so as to have a capacitor and two switches arranged before and after the capacitor, however, in fact, it has such a configuration as illustrated in FIG. 2.

The TADC 20 has the voltage-to-time converter (VTC) 21, the zero cross detector (ZCD) 26, the time-to-digital converter (TDC) 27, and the timing generation circuit 25. In fact, the TADC 20 has such a configuration as illustrated in FIG. 6A.

Further, the switch 15 configured to connect the output of the CDAC 11 to the VTC 21 is provided.

Figure 9:
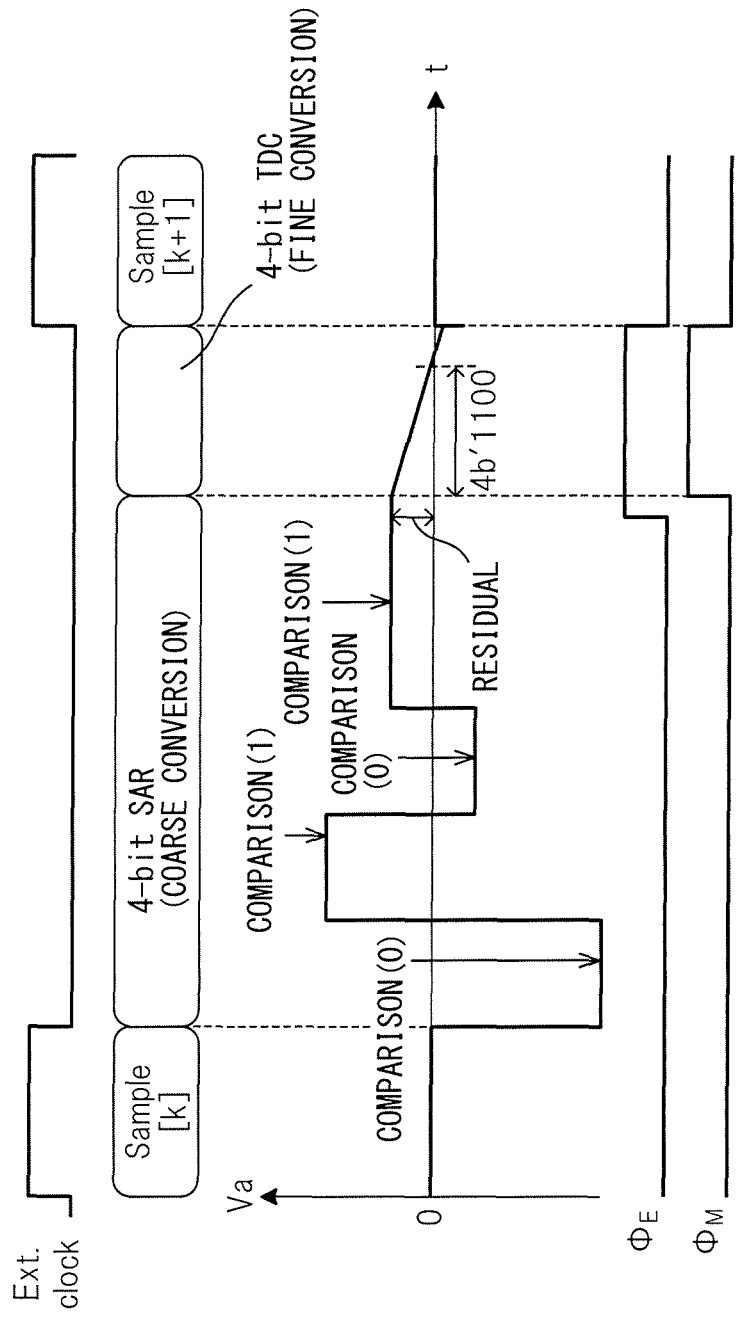
FIG. 9 is a time chart illustrating an example of the operation of the ADC of the first embodiment in the case where m=4 and n=4.

FIG. 9 is a time chart illustrating an example of the operation of the ADC of the first embodiment in the case where m=4 and n=4. In other words, the case is illustrated, where after the higher-order four bits are determined by coarse conversion processing, the lower-order four bits are determined by fine conversion, and thus, digitally converted data of eight bits in total is obtained. Consequently, in this case, the CDAC 11 has five sub capacitors the capacitance ratio of which is 1:1:2:4:8.

The SAR-ADC 10 determines whether the voltage Va of the CDAC 11 is lower or higher than 0 V at timings indicated by arrows. In the example illustrated schematically, the coarse conversion result is 1010 (all the bits are inverted by the encoder). By reflecting the result of the third comparison, the residual voltage Va is generated and in accordance with the result of the fourth comparison, charge or discharge is set. On the other hand, that the fourth determination is completed is notified to the timing generation circuit 25 of the TADC 20 by a signal ΦE. Triggered by the signal ΦE, the timing generation circuit 25 is activated and control signals including ΦE, a signal ΦM to control the switch 15, etc., are output, and thus, each block of the TADC 20 is caused to operate. Here, ΦE and ΦM are not related to (not synchronized with) clocks supplied from outside. The TADC 20 digitizes the residual voltage Va by converting it into time information. FIG. 9 illustrates an example in which the result of fine conversion processing is 1100 and an 8-bit ADC digital output 10101100 is obtained.

Figure 10:
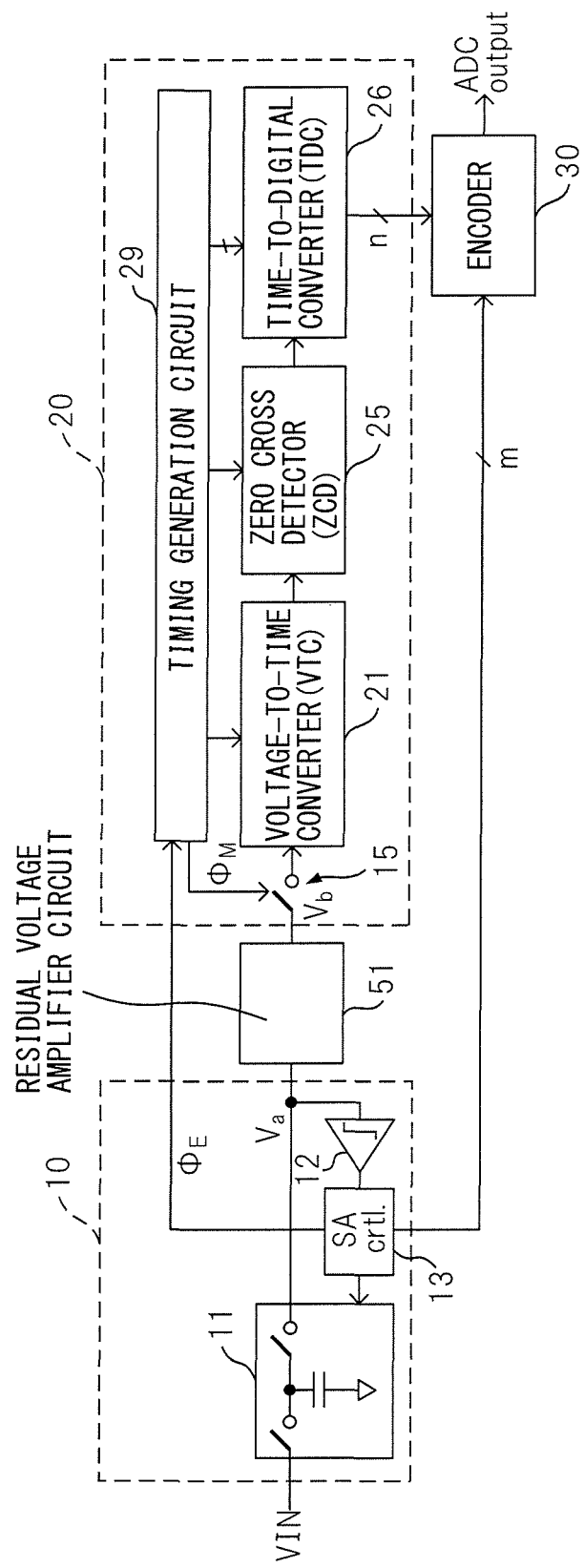
FIG. 10 is a diagram illustrating an outline of a configuration of an ADC of a second embodiment.

FIG. 10 is a diagram illustrating an outline of a configuration of an ADC of a second embodiment.

The ADC of the second embodiment differs from that of the first embodiment in that a residual voltage amplifier circuit 51 configured to amplify the residual voltage Va output from the CDAC 11 of the SAR-ADC 10 is provided. The switch 15 is provided in the TADC 20. In the voltage-to-time converter (VTC) 21, a capacitor configured to hold the amplified residual voltage is provided in parallel to the fixed current source 22 and the switch 23. Other parts are the same as those of the first embodiment.

In the second embodiment, the residual voltage Va is amplified, and therefore, it is possible to relax precision requirements in analog signal processing of the fine conversion processing in the TADC 20. For example, if the amplification factor is taken to be A, the precision requirements will be relaxed to 1/A. For example, in the case where A=8, precision requirements are relaxed to ⅛=½³, and therefore, it is possible to relax an amount corresponding to three bits.

As illustrated in FIG. 7, the voltage-to-time converter (VTC) 21 has the fixed current source 41 for charge and the fixed current source 42 for discharge and controls which of the fixed current sources to be connected in accordance with the final determination result in the SAR-ADC 10, i.e., in accordance with the sign of the residual voltage.

In the case where the offset of the comparator 12 of the SAR-ADC 10 is very small (that is, substantially 0 V), the final determination result in coarse conversion will be 1 (positive) when the residual voltage is plus (+). Based on the result, the VTC 21 performs control so that the fixed current source 42 for discharge is connected in order to discharge the positive residual voltage. Due to this, the positive residual voltage Va gradually reduces and reaches 0 V eventually, and therefore, this point of time is detected by the ZCD 25 and fine conversion is performed.

On the other hand, when the residual voltage is minus (−), the final determination result in coarse conversion will be 0 (negative). Based on the result, the VTC 21 performs control so that the fixed current source 41 for charge is connected in order to charge the negative residual voltage. Due to this, the negative residual voltage Va gradually increases and reaches 0 V eventually, and therefore, this point of time is detected by the ZCD 25 and fine conversion is performed.

Figure 11:
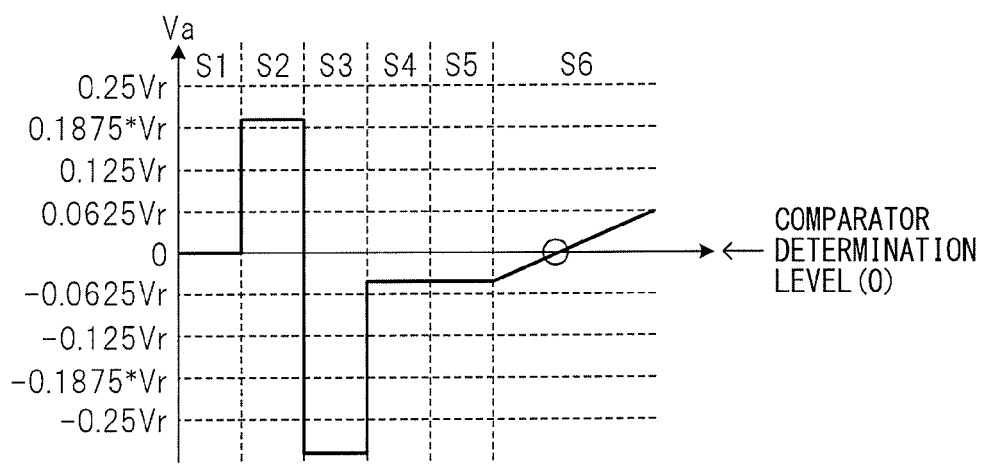
FIG. 11 is a diagram explaining fine conversion processing in the case where the offset of the comparator is very small and coarse conversion processing of the higher-order three bits is performed successfully in coarse conversion processing in the SAR-ADC of the first embodiment.

FIG. 11 is a diagram explaining fine conversion processing in the case where the offset of the comparator 12 is very small and coarse conversion processing of the higher-order three bits is performed successfully in coarse conversion processing in the SAR-ADC 10 of the first embodiment. FIG. 11 illustrates the case where the residual voltage Va is minus (−). At step S1, reset processing is performed and at step S2 sampling is performed and also determination of the first bit is performed. At step S3, switching of connections of the sub capacitors is performed in accordance with the determination result of the first bit and also determination of the second bit is performed. At step S4, switching of connections of the sub capacitors is performed in accordance with the determination result of the second bit and also determination of the third bit is performed. The residual voltage is formed at step S4. At step S5, one of discharge and charge is set in accordance with the determination result of the third bit. At step S6, discharge or charge is performed and in FIG. 11, the negative residual voltage Va is changed and gradually increases and eventually reaches 0 V.

Figure 12:
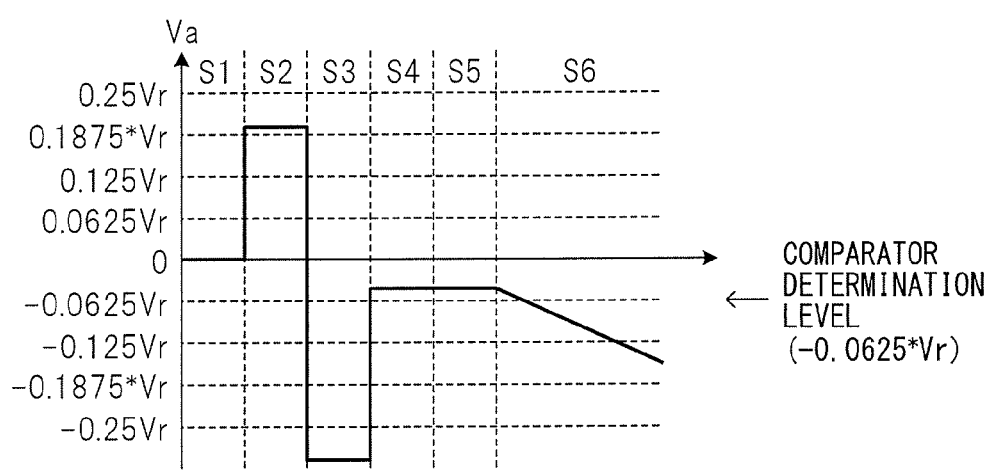
FIG. 12 is a diagram explaining fine conversion processing in the case where the offset of the comparator is not zero and an error has occurred in comparison of the residual voltage Va in coarse conversion processing in the SAR-ADC of the first embodiment.

FIG. 12 is a diagram explaining fine conversion processing in the case where the offset of the comparator 12 is not zero and an error has occurred in comparison of the residual voltage Va in coarse conversion processing in the SAR-ADC 10 of the first embodiment. FIG. 12 illustrates the case where the residual voltage Va is minus (−) and the determination level of the comparator 12 becomes lower than the residual voltage due to the offset. Specifically, FIG. 12 illustrates the case where the determination level offset of the comparator 12 has changed to −0.0625 Vr due to the offset and Va has become higher than −0.0625 Vr and lower than 0 V, that is, −0.0625 Vr<Va<0 V. In this case also, steps S1 to S3 are the same as those of FIG. 11.

At step S4, the residual voltage Va is determined to be positive due to the offset of the comparator 12 and at step S5, setting is done so that the residual voltage Va is discharged. Consequently, at step S6, the negative residual voltage Va is discharged and reduces gradually, and therefore, it never reaches 0 V. Because of the above, the ZCD 25 does not detect zero cross, a conversion error occurs because of time out (time over), and the ADC generates a mis-code as a result in fine conversion processing.

Figure 13A:
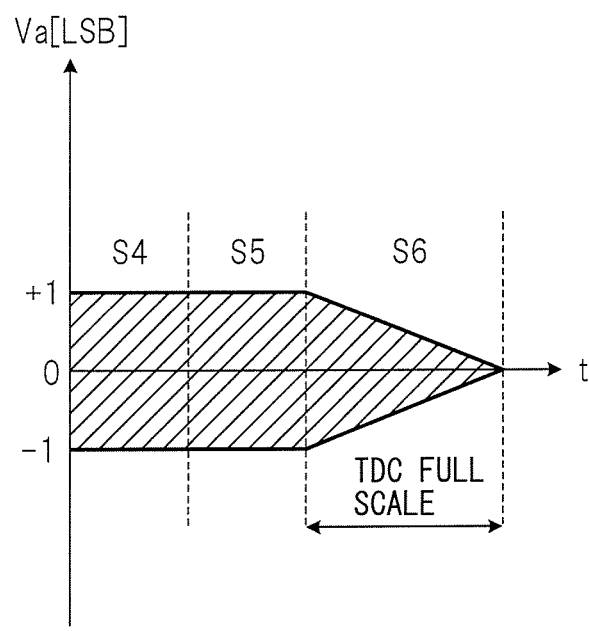
Figure 13B:
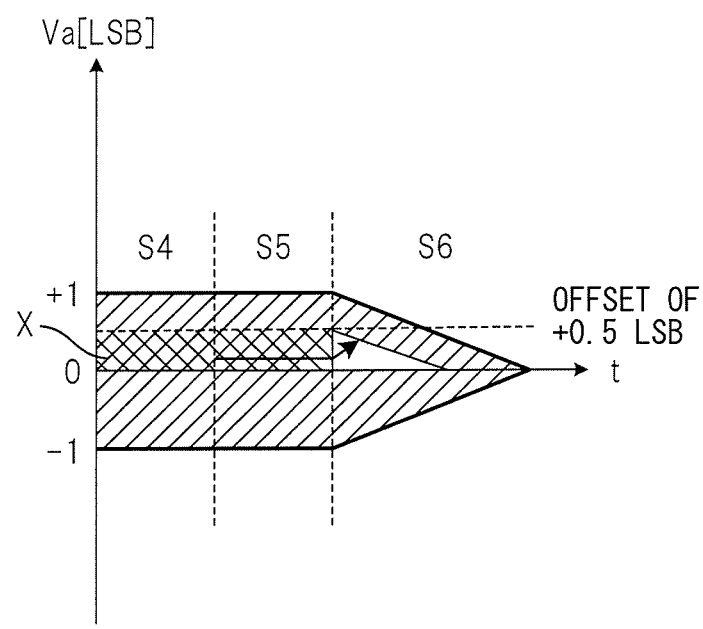

FIG. 13A an FIG. 13B are diagrams explaining the influence of the offset of the comparator 12 in the first embodiment, wherein, FIG. 13A illustrates the case where the offset is zero and FIG. 13B illustrates the case where there is an offset of +0.5 LSB.

As illustrated in FIG. 13A, Va is within the range between 0 V-1 LSB and 0 V+1 LSB at steps S4 and S5 and in the case where Va is positive, discharge is set and in the case where Va is negative, charge is set and Va crosses 0 V at step S6.

In contrast to this, as illustrated in FIG. 13B, in the case where the comparator 12 has an offset of +0.5 LSB, even when Va is positive, in the case where 0 V<Va<+0.5 LSB, charge is set, and therefore, Va never crosses 0 V at step S6. In other words, the region represented by X in FIG. 13B is a region in which Va never crosses 0 V at step S6.

An analog-to-digital converter circuit (ADC) of a third embodiment, to be explained next, performs AD conversion processing so that no error occurs even in the case where the comparator 12 of the SAR-ADC 10 has an offset if the offset is within ±1 LSB.

The ADC of the third embodiment has a configuration similar to that of the ADC of the first embodiment illustrated in FIG. 8 but differs in the configuration of the sub capacitors of the CDAC 11 of the SAR-ADC 10 and in generation processing of the residual voltage. Specifically, in the first embodiment, the final determination result in the SAR-ADC 10 is used to select to discharge or charge the residual voltage but is not reflected in the residual voltage. In contrast to this, in the third embodiment, the final determination result in the SAR-ADC 10 is used to select to discharge or charge the residual voltage and is also reflected in the residual voltage.

FIG. 14A to FIG. 14F are diagrams illustrating the configuration of sub capacitors of the CDAC 11 of the ADC of the third embodiment and examples of voltages to be applied to each sub capacitor of the capacitive DAC 11 in coarse conversion processing and in fine conversion processing and voltages at the common node.

As illustrated in FIG. 14A to FIG. 14F, the CDAC 11 of the ADC of the third embodiment has six sub capacitors whose capacitance ratio is 0.5:0.5:0.5:0.5:2:4. In other words, the CDAC 11 has a configuration in which the two sub capacitors having a capacitance value of 1 of the four sub capacitors of the first embodiment, illustrated in FIG. 5A to FIG. 5D, are divided into four sub capacitors having a capacitance value of 0.5. With reference to FIG. 14A to FIG. 14F, coarse conversion processing and fine conversion processing in the ADC of the third embodiment are explained. As in the case of FIG. 5, it is assumed that VRH=Vr and VRL=−Vr. That is, it is assumed that the full scale of AD conversion processing is 2 Vr.

As illustrated in FIG. 14A, at step S1, each of the switch group of the capacitive DAC 11 is connected so that the voltage Vin of the input signal is applied, and also the switch 14 is brought into the connected state. Due to this, a state where Vin is held in all the sub capacitors of the capacitive DAC 11, i.e., a state where sampling of the voltage VIN of the input signal is performed is brought about. It is assumed that Vin=−0.2 Vr.

At step S2, after the switch 14 is changed into the cutoff state, switching is performed so that +Vr is applied to the terminal of the sub capacitor 4C having the largest capacitance value and −Vr is applied to the terminals of the sub capacitors having the second largest capacitance value or smaller capacitance values as illustrated in FIG. 14B. Due to this, the voltage Va at the common node of the capacitive DAC 11 becomes equal to −Vin=0.2 Vr, that is, Va=−Vin=0.2 Vr. Consequently, a state to determine the highest-order bit D2 of coarse conversion is created and the first comparison is performed. The comparator 12 compares Va (0.2 Vr) and the reference potential (0 V) and outputs the comparison result. In this case, Va is higher than 0 V, and therefore, the comparison result will be D2=1 (positive).

At step S3, because D2=1, the successive approximation controller 13 changes the voltage to be applied to the other terminal of the capacitor 4C to −Vr and connects the voltage to be applied to the other terminal of the capacitor 2C to +Vr. Due to this, as illustrated in FIG. 14C, Va becomes equal to −Vin−0.5 Vr=−0.3 Vr, that is, Va=−Vin−0.5 Vr=−0.3 Vr. Consequently, a state to determine the bit D1 is created and the second comparison is performed. The comparator 12 compares Va (−0.3 Vr) and the reference potential (0 V) and outputs the comparison result. In this case, Va is lower than 0 V, and therefore, the comparison result will be D1=0 (negative).

At step S4, because D1=0, the successive approximation controller 13 keeps the voltage applied to the other terminal of the capacitor 2C at +Vr, changes the voltage to be applied to the other terminals of the two capacitors 0.5C to +Vr, and changes the voltage to be applied to the other terminals of the other two capacitors 0.5C to −Vr. Due to this, as illustrated in FIG. 14D, Va becomes equal to −Vin−0.5 Vr+0.25 Vr=−0.05 Vr, i.e., Va=−Vin−0.5Vr+0.25Vr=−0.05 Vr. Consequently, a state to determine the bit D0 is created and the third comparison is performed. The comparator 12 compares Va (−0.05 Vr) and the reference potential (0 V) and outputs the comparison result. In this case, Va is lower than 0 V, and therefore, the comparison result will be D0=0 (negative).

At step S5, the successive approximation controller 13 switches the voltages to be applied to the four sub capacitors having a capacitance of 0.5 C in accordance with the determination result of D0.

In the case where D0=0 (negative), as illustrated in FIG. 14F, the voltage to be applied to the other terminal of the third sub capacitors having a capacitance of 0.5 C is changed to −Vr. In other words, in the case where D0=0 (negative), the voltage −Vr is applied to the other terminals of the three of the four sub capacitors having a capacitance of 0.5 C and the voltage +Vr is applied to the other terminal of the other one of the four sub capacitors having a capacitance of 0.5C. Due to this, as illustrated in FIG. 14F, Va becomes equal to −Vin−0.5 Vr+0.25 Vr−0.125 Vr=−0.175 Vr, that is, Va=−Vin−0.5 Vr+0.25 Vr−0.125 Vr=−0.175 Vr.

A case is considered where D0 is determined to be 0 (D0=0) normally as described above, however, D0 is determined to be 1 (positive), i.e., D0=1 (positive) due to the offset of the comparator 12. In this case, as illustrated in FIG. 14E, the voltage to be applied to the other terminal of the second sub capacitor having a capacitance of 0.5 C is changed to +Vr. In other words, in the case where D0=1 (positive), the voltage +Vr is applied to the other terminals of the three of the four sub capacitors having a capacitance of 0.5 C and the voltage −Vr is applied to the other terminal of the other one of the four sub capacitors having a capacitance of 0.5 C. Due to this, as illustrated in FIG. 14E, Va becomes equal to −Vin−0.5 Vr+0.25 Vr+0.125 Vr=+0.075 Vr, that is, Va=−Vin−0.5 Vr+0.25 Vr+0.125 Vr=+0.075 Vr.

In the first embodiment, the final determination result of the coarse conversion processing in the SAR-ADC 10 is used only to select to discharge or charge the residual voltage and is not reflected in the residual voltage. In contrast to this, in the third embodiment, the final determination result of the coarse conversion processing in the SAR-ADC 10 is used to select to discharge or charge the residual voltage, and is also used to change the residual voltage. Further, the final determination result of the coarse conversion processing is reflected so that the residual voltage Va becomes more distant from 0 V. For example, while Va=−0.05 Vr in FIG. 14D, in FIG. 14F, Va=−0.175 Vr and in FIG. 14E, Va=+0.075 Vr. By reflecting the final determination result of the coarse conversion processing so that the residual voltage Va becomes more distant from 0 V as described above, it is possible to suppress an error from occurring even in the case where the comparator 12 has an offset.

Figure 15A:
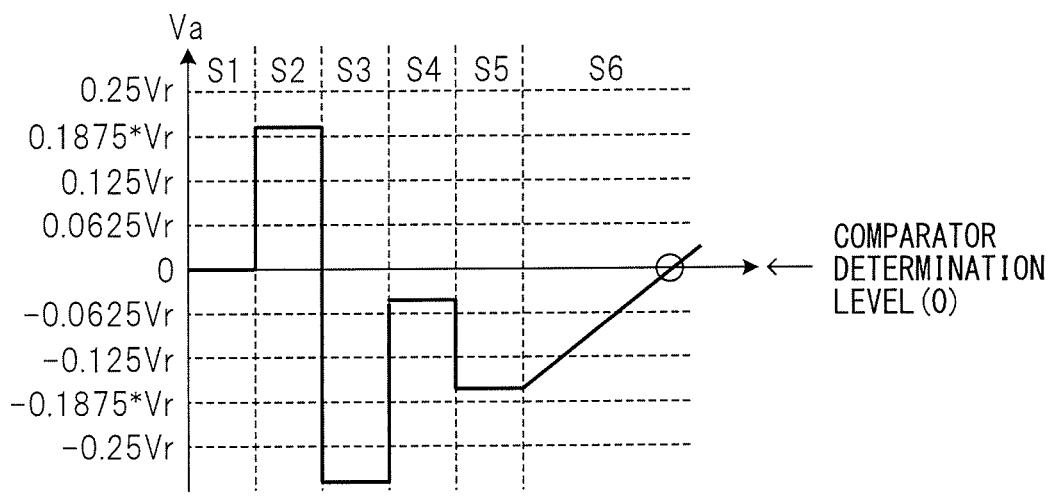
Figure 15B:
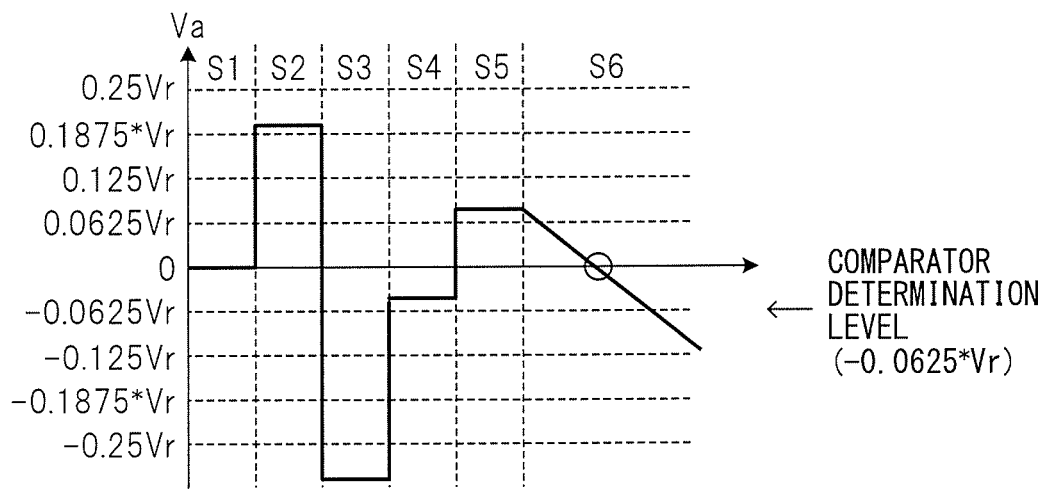

FIG. 15A and FIG. 15B are diagrams illustrating examples of changes in the voltage Va in the coarse conversion processing and in the fine conversion processing explained in FIG. 14A to FIG. 14F, wherein FIG. 15A illustrates a case where the offset of the comparator 12 is very small (offset=0 V) and FIG. 15B illustrates a case where the offset=−0.0625 Vr. FIG. 15A and FIG. 15B illustrate cases where the residual voltage Va is minus (−). With reference to FIG. 15A and FIG. 15B, the effect obtained by reflecting the final determination result of the coarse conversion processing in the ADC of the third embodiment so that the residual voltage Va becomes more distant from 0 V is explained.

Steps S1 to S4 are the same as those of the first embodiment, and therefore, explanation thereof is omitted.

As illustrated in FIG. 15A, in the case where the offset of the comparator 12=0 V, at step S4, D0 is determined to be 0 (D0=0). Normally, when D0 is determined to be "0", the voltage connected to the other terminal of the sub capacitor is switched to another so as to increase Va. In contrast to this, in the third embodiment, as illustrated in FIG. 14F, the voltage connected to the other terminal of the sub capacitor is switched to another so as to reduce Va. Due to this, the residual voltage Va becomes equal to −0.175 Vr (Va=−0.175 Vr) and is output to the VTC 21 of the TDCA 20. Because D0 is determined to be 0 (D0=0), the VTC 21 sets the switches so that the residual voltage Va is charged. Due to this, the residual voltage Va increases at a fixed rate of change and eventually reaches 0 V, and therefore, the ZCD 26 detects the instant when Va becomes 0V.

As illustrated in FIG. 15B, in the case where the offset of the comparator 12=−0.0625 Vr, at step S4, Va=−0.05 Vr and D0 is determined to be 1 (D0=1). Normally, when D0 is determined to be "1", the voltage connected to the other terminal of the sub capacitor is switched to another so as to reduce Va. In contrast to this, in the third embodiment, as illustrated in FIG. 14E, the voltage connected to the other terminal of the sub capacitor is switched to another so as to increase Va. Due to this, the residual voltage Va becomes equal to +0.075 Vr (Va=+0.075 Vr) and is output to the VTC 21 of the TDAC 20. Because D0 is determined to be 1 (D0=1), the VTC 21 sets the switches so as to discharge the residual voltage Va. Due to this, the residual voltage Va reduces at a fixed rate of change and eventually reaches 0 V, and therefore, the ZCD 26 detects the instant when Va reaches 0 V.

The amount by which the final determination result of the coarse conversion processing in redundancy processing of the residual voltage Va is set to a value smaller than the least significant bit (LSB) of the coarse conversion processing. For example, in FIG. 14A to FIG. 14F and in FIG. 15A and FIG. 15B, the range in which conversion is performed is extended by increasing the resolution of the TDC 27 of the TADC 20 by one bit in accordance with redundancy by making a shift of ±0.5 LSB. In the examples in FIG. 14A to FIG. 14F and in FIG. 15A and FIG. 15B, 1 LSB of the coarse conversion processing is 2 Vr·$2^3$=0.25 Vr, and therefore, ±0.5 LSB=±0.125 Vr holds. By this redundancy, the offset of the comparator is permitted up to ±0.5 LSB. It is possible to set redundancy to an arbitrary value not more than 1 LSB and resolution of the TDC 27 in the subsequent stage is adjusted in accordance with the width of the redundancy. There are various methods for making a shift of ±0.5 LSB and the methods are not limited to the circuit configurations in FIG. 14A to FIG. 14F.

Figure 16:
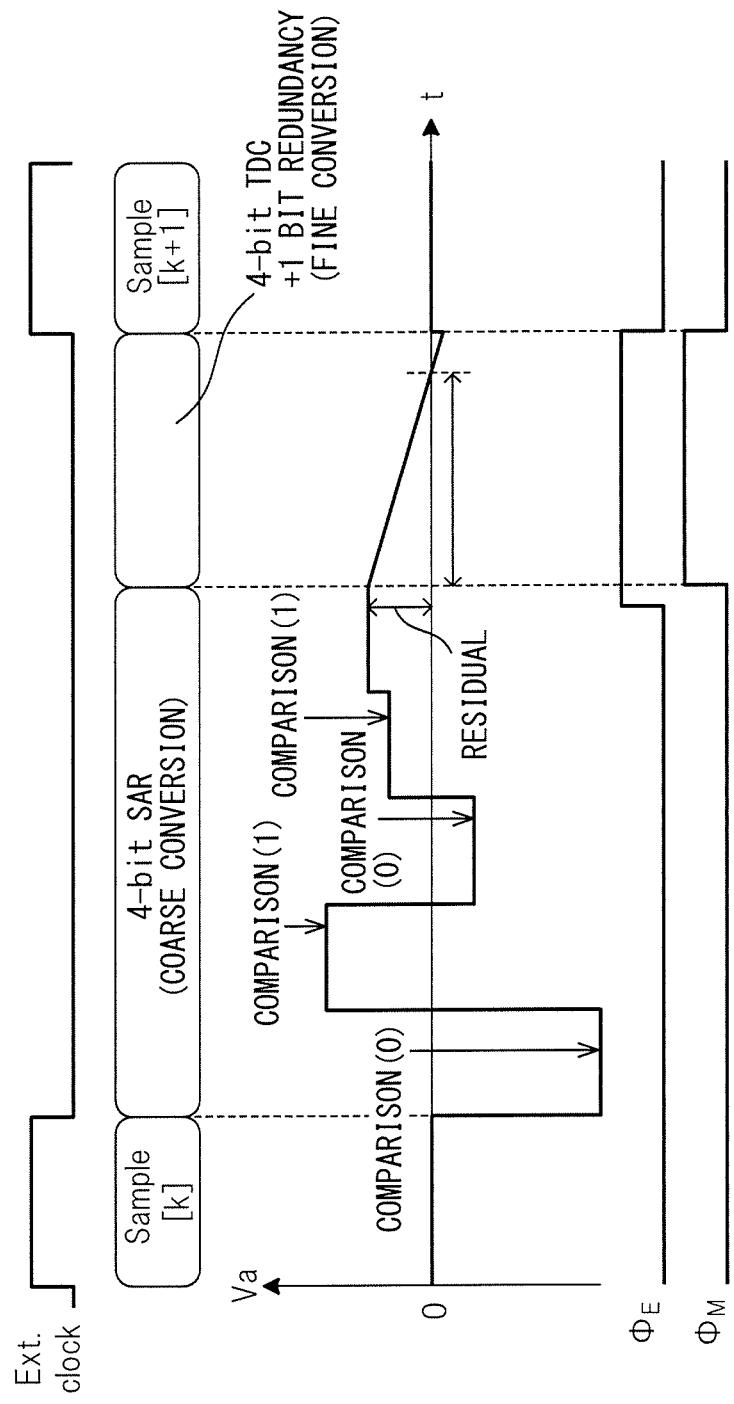
FIG. 16 is a time chart illustrating the operation of the ADC of the third embodiment, illustrating a case where m=4 and n=4.

FIG. 16 is a time chart illustrating the operation of the ADC of the third embodiment, illustrating a case where m=4 and n=4. In other words, FIG. 16 illustrates a case where after the higher-order four bits are determined by coarse conversion processing, the lower-order four bits are determined by fine conversion processing, and thereby, digitally converted data of eight bits in total is obtained. However, in the fine conversion processing, five bits including one redundant bit that is added are determined.

The determination of the higher-order four bits in the coarse conversion processing is the same as that in the case of the first embodiment in FIG. 9. In FIG. 14A to FIG. 14F, the higher-order bits are determined to be 0101, that is "5" (0101="5"). In the third embodiment, as in the first embodiment, in the case where "1" is determined by the determination of LSB of the coarse conversion processing, setting is done so that the residual voltage Va is discharged and in the case where "0" is determined, setting is done so that the residual voltage Va is charged. However, in the third embodiment, after Va is changed in accordance with the determination result of LSB in the coarse conversion processing, it is output as a residual voltage. Specifically, in the case where "1" is determined by the determination of LSB of the coarse conversion processing, Va is increased by ½ LSB and in the case where "0" is determined, Va is reduced by ½ LSB. In FIG. 16, the determination result of LSB of the coarse conversion processing is "1", and therefore, Va is increased by ½ LSB. Fine conversion processing is performed on the residual voltage Va having been subjected to redundancy processing in this manner.

Figure 17A:
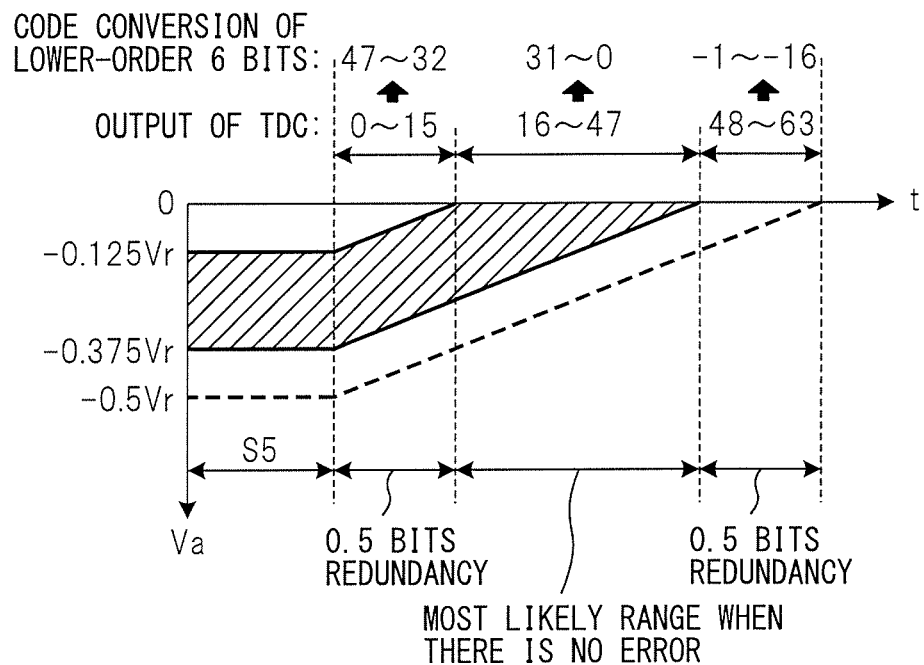
Figure 17B:
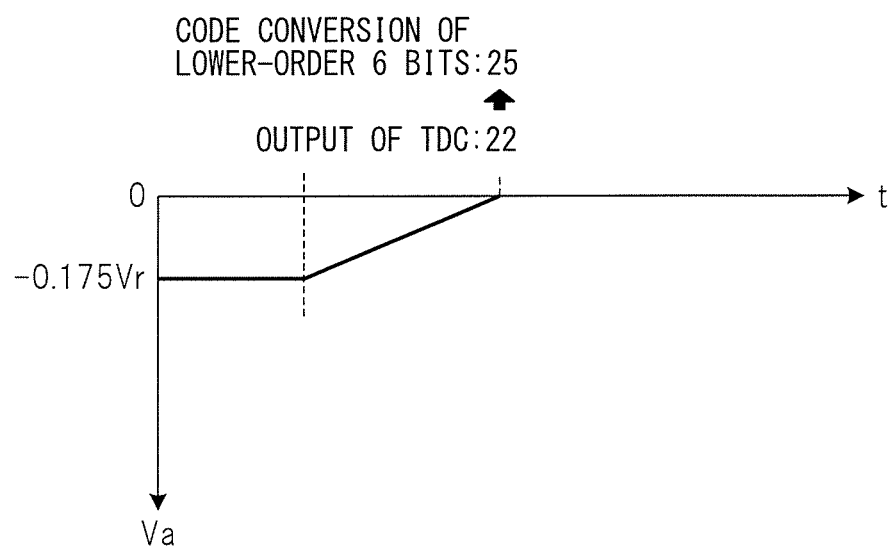

FIG. 17A and FIG. 17B are diagrams for explaining fine conversion processing in the case where the residual voltage is negative, wherein FIG. 17A is a diagram for explaining fine conversion processing and FIG. 17B illustrates a conversion example in the case where the offset of the comparator 12 is 0 V.

FIG. 17A illustrates an example of the case where the higher-order three bits are determined by coarse conversion processing and the lower-order five bits (one redundant bit is added) are determined by fine conversion processing, illustrating an example of the case where the residual voltage Va<0 V and Va and a code output from the TDC 27 are made to correspond to each other.

As illustrated in FIG. 17A, in the fine conversion processing, the original range of five bits (16 to 47) has a redundant range (0 to 15 and 48 to 63) of 16 codes corresponding to 0.5 bits on both side thereof, that is, a redundant range of one bit in total (32 codes). Because of this, the encoder circuit 30 obtains the codes of the lower-order bits by subtracting the codes corresponding to this redundant range from the codes of the lower-order bits obtained by the fine conversion processing. Consequently, the code conversion will be "47−(output of TDC 27) when represented by decimal numbers.

FIG. 17B illustrates an example of the case where there is no offset error in the comparator 12 of FIG. 15A, illustrating the case where Va=−0.175 Vr. At this time, the output of the TDC 27 will be int (64*0.175 Vr/0.5 Vr)=22. The encoder circuit 30 performs the above-described conversion of "47−22" on this code to obtain a conversion code of 25. In FIG. 15A, the higher-order three bits are 100, that is, 128 after converted into a decimal number, and 25, which is the result of the lower-order six bits, is added and as an AD converted value as a whole, a code of 153 of eight bits is obtained. However, as illustrated in FIG. 15A, the analog input VIN is inverted when viewed from Va by the behavior of the CDA 11, and therefore, 256−153=103 obtained by inverting the code will be the final result of AD conversion.

Figure 18A:
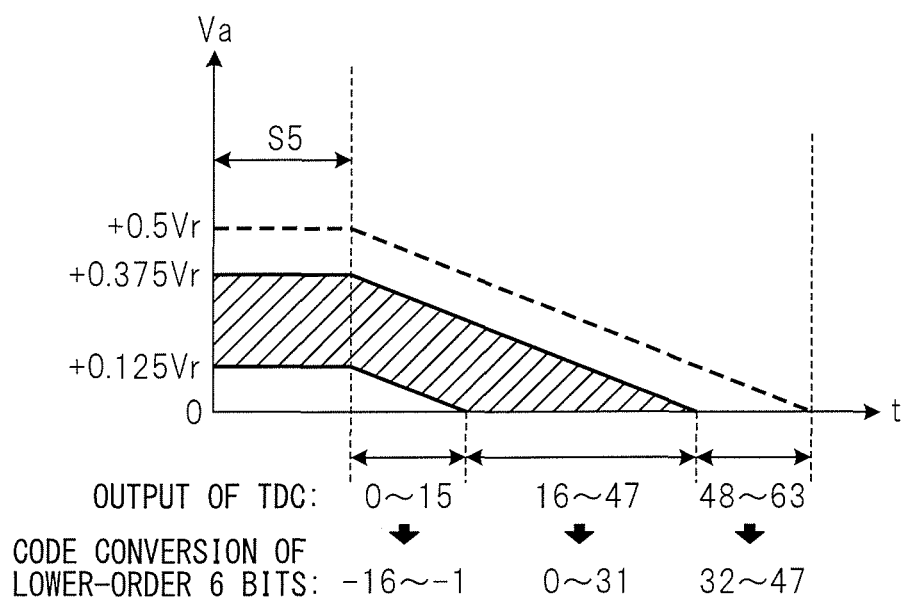
Figure 18B:
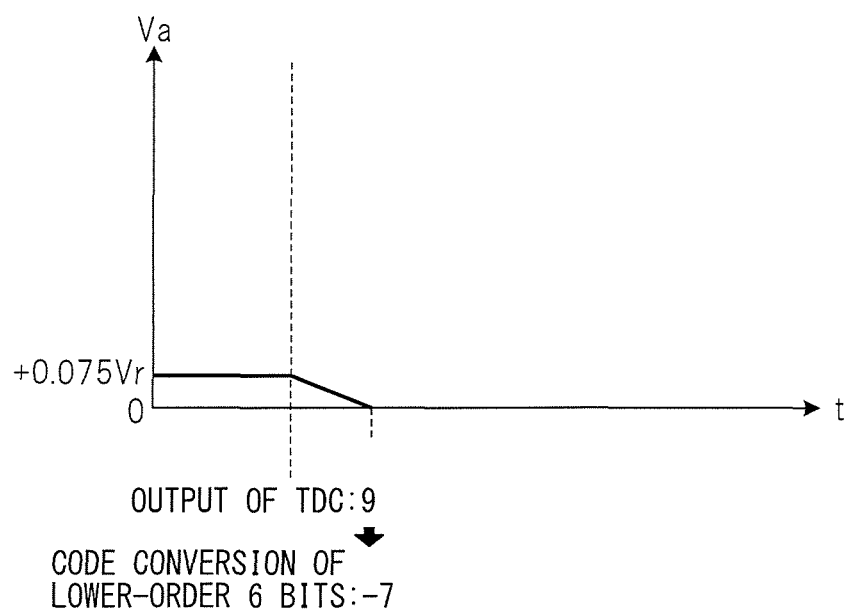

FIG. 18A and FIG. 18B are diagrams for explaining fine conversion processing in the case where the residual voltage is positive, wherein FIG. 18A is a diagram for explaining fine conversion processing and FIG. 18B illustrates a conversion example in the case where the offset of the comparator 12 is 0 V. This case is also an example of the case where the higher-order three bits are determined by coarse conversion processing and the lower-order five bits are determined by fine conversion processing.

As illustrated in FIG. 18A, the original five-bit range (16 to 47) determined by fine conversion processing has a redundant range (0 to 15 and 48 to 63) of 16 codes corresponding to 0.5 bits on both sides thereof, i.e., a redundant range of one bit in total (32 codes). Because of this, the encoder circuit 30 obtains the codes of the lower-order bits by subtracting the codes corresponding to the redundant range from the codes of the lower-order bits obtained by fine conversion processing. Consequently, the code conversion will be "(output of TDC 27)−16" when represented by decimal numbers.

FIG. 18B illustrates an example of the case where there is an offset of −0.0625 Vr in the comparator 12 of FIG. 15B, illustrating the case where Va=0.075 Vr. At this time, the output of the TDC 27 will be int (64*0.075 Vr/0.5 Vr)=9. The encoder circuit 30 performs the above-described conversion of "9−16" on this code to obtain a converted code of −7. In FIG. 15B, the higher-order three bits are 101, i.e., 160 when converted into a decimal number, and therefore, the above-mentioned result of −7 of the lower-order six bits is added and as an AD converted value as a whole, a code of 153 of eight bits is obtained. In the same manner as described above, the analog input VIN is inverted when viewed from Va by the behavior of the CDAC 11, and therefore, the final AD conversion result will be 256−153=103 by inverting the code also. This code agrees with the value illustrated in FIG. 17A, meaning that the influence of the offset is not exerted.

Figure 19A:
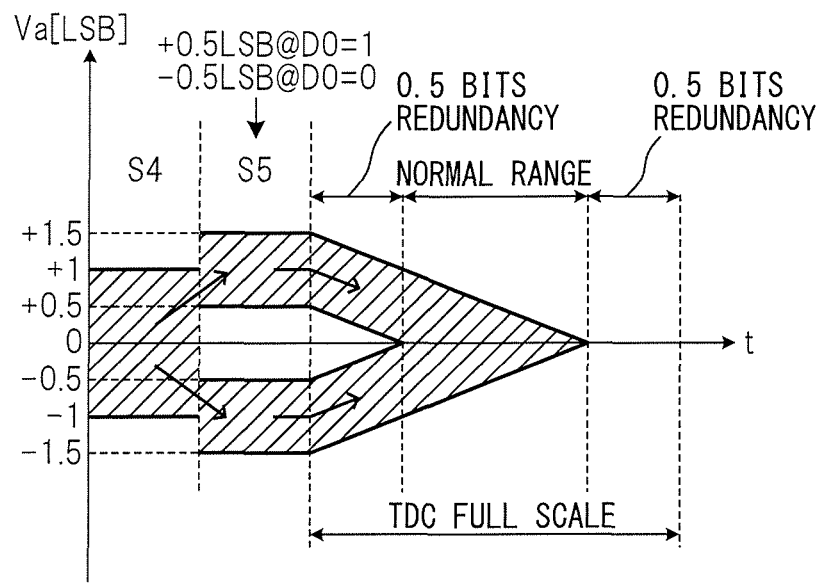
Figure 19B:
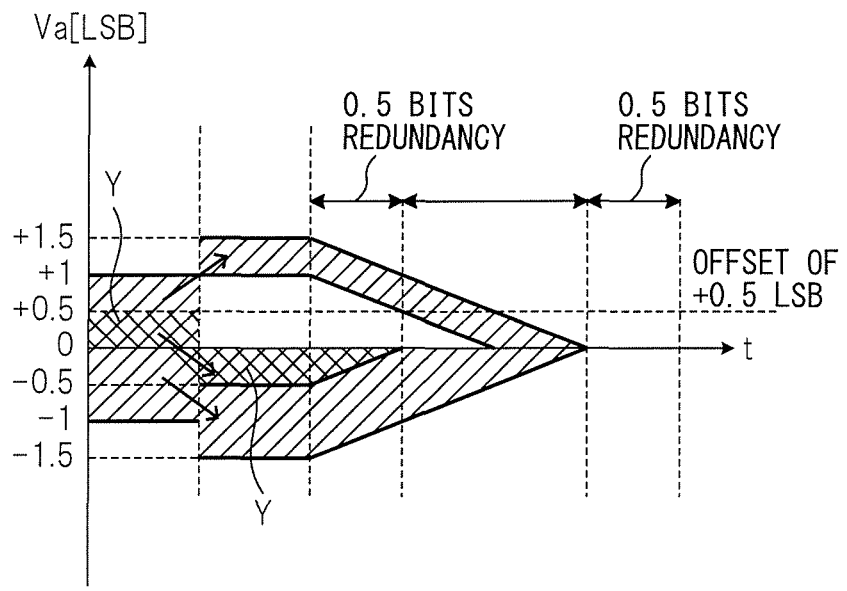

FIG. 19A and FIG. 19B are diagrams for explaining the influence of the offset of the comparator 12 in the third embodiment, wherein FIG. 19A illustrates a case where the offset is zero and FIG. 19B illustrates a case where there is an offset of +0.5 LSB.

As illustrated in FIG. 19A, Va is within the range between 0 V−1 LSB and 0 V+1 LSB at step S4. In the case where D0=1, the residual voltage Va increases 0.5 LSB at step S5 and the residual voltage Va falls in the range between +0.5 LSB and +1.5 LSB and discharge is set. In the case where D0=0, the residual voltage Va reduces 0.5 LSB at step S5 and the residual voltage Va falls in the range between −1.5 LSB and −0.5 LSB and charge is set. In either case, Va crosses 0 V at step S6.

The case where the comparator 12 has an offset of +0.5 LSB for 1 LSB of coarse conversion processing as illustrated in FIG. 13B described previously is considered. In the first embodiment, the comparator 12 determines that Va is negative also in the range of 0<Va<0.5 LSB, and therefore, Va is charged also in the region represented by X as in the part of Va<0, and therefore, and zero cross does not occur.

On the other hand, in the third embodiment, as illustrated in FIG. 19B, even if the comparator 12 determines that Va is negative in the range of 0<Va<0.5 LSB, at step S5, Va is shifted so as to be smaller than 0 V, and therefore, Va is charged at step S6 and zero cross occurs without fail. By detecting the time until the zero cross occurs by the amount corresponding to the redundant bit of the TDC 27 and by correcting the result of coarse conversion in response to the detection in the redundant region, it is possible to eliminate the influence of the offset. In the third embodiment, due to the redundancy of LSB of coarse conversion processing, not only the offset of the comparator 12 but also the offset of the amplifier circuit is permitted to a certain extent.

The ADC of the present embodiment is compared with a general ADC system.

The output (=input to the comparator) voltage Va of the CDAC of the successive approximation register ADC (SAR-ADC) asymptotically becomes close to the reference potential (0 V in the diagram) of the comparator 12 by the binary search system. If all the determination results of k bits are applied to the CDAC, Va becomes the residual voltage between the sampled analog input voltage and the digital level voltage closest to the analog input voltage VIN represented by the k-bit digital code. If it is possible to perform fine conversion of the residual voltage Va with as many bits as possible and in as short a time as possible, the number of times of loop of the SAR-ADC may be reduced and as a result, the conversion time may be reduced compared to the case where the SAR-ADC is included.

As a system to perform AD conversion with multiple bits in a short time, the flash system capable of implementing AD conversion in one clock is widely known. However, with the flash system, it is difficult to increase a resolution n of fine conversion processing and the effect that "speed is increased after the resolution (number of times of loop) of the SAR-ADC is reduced while maintaining low power consumption" is not obtained. In the flash system, for the resolution n, $2^n$ divided voltage levels are generated and the comparison operation is performed with $2^n$ comparators at a time. Because of this, with the ADC adopting the flash system, for the resolution n, the circuit area, the power to be consumed, and the cost increase exponentially. If a large value is selected for n in the flash system, superiority in power and area to the SAR-ADC is lost considerably. For the reasons described above, it is difficult to increase the resolution n in the flash system. In view of a reduction of the ratio of power consumption and area of the circuit part adopting the flash system relative to that of the SAR-ADC to a predetermined value or less, it is believed that the practical limit of n is 3 to 4.

Another reason for the difficulty in increasing the resolution n is the need to generate and determine $2^n$ divided voltage levels. The residual voltage the full scale of which is reduced by coarse conversion processing is further divided and determined, and therefore, accurate generation/control of divided voltage levels and measures to reduce the offset of all the $2^n$ comparators to as close to zero as possible are indispensable. In order to implement the measures, it is necessary to increase the element size and to add auxiliary circuits, and therefore, power and area used for the auxiliary circuits increase. In order to obviate the need to add circuits, it may be thought that the limit of n is 2 to 3.

As described above, in the flash system, it is difficult to increase the resolution n, and therefore, in view of the circuit scale and power consumption, it is necessary to increase the resolution of the SAR-ADC that performs coarse conversion processing. Because of this, it is difficult to "increase speed by reducing the resolution (number of times of loop) of the SAR-ADC".

Consequently, in the embodiment, the fixed-quantity change time measurement converter circuit configured to temporarily convert the residual voltage into time information and to perform fine conversion along the time axis is used. In the fixed-quantity change time measurement converter circuit, by changing the residual voltage Va at a certain slope from a certain time, i.e., the start time ts, the absolute value of the difference between the start time ts and the time te when the voltage reaches a fixed level (that is, ts–te) is measured by the TDC. If the residual voltage is changed at a fixed slope, te and Va are in a linear relationship, and therefore, by digitizing the absolute value of (ts–te), the residual voltage Va is also digitized. Further, even if the residual voltage becomes small, by reducing the slope at which the residual voltage is changed, it is also possible to amplify information in the time axis direction.

Although the operation of the ADC of the embodiment is fast compared to that of the SAR-ADC with the same resolution, the power consumption, the circuit scale, and the cost are comparatively low. Further, in transition from coarse conversion processing by the SAR-ADC to fine conversion processing by the TADC, by performing processing to give redundancy, it is possible to reduce the influence of the offset of the comparator and the amplifier on conversion precision, although there is somewhat a reduction in speed.

As described above, according to the embodiments, the ADC is realized, which is capable of high-speed operation while suppressing power and the circuit cost compared to the SAR-ADC with the same resolution.

The ADC disclosed herein has a simple circuit configuration, operates at high-speed, and consumes small power compared to a general SAR-ADC with the same resolution.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An analog-to-digital converter circuit configured to convert an analog input signal voltage into a digital signal with a predetermined number of bits, comprising:
    a successive approximation converter circuit configured to sequentially compare and coarsely convert the analog input signal voltage into a digital signal with a number of higher-order bits, and also to output a residual voltage between the analog input signal voltage and an analog signal voltage corresponding to the digital signal with the number of higher-order bits;
    a fixed-quantity change time measurement converter circuit configured to finely convert the residual voltage into a digital signal with a number n of lower-order bits by changing the residual voltage at a fixed rate of change and by measuring the time until a predetermined value is reached; and
    an encoder circuit configured to generate a digital signal with the predetermined number of bits by combining the digital signal with the number of higher-order bits output from the successive approximation converter circuit and the digital signal with the number of lower-order bits output from the fixed-quantity change time measurement converter circuit.

2. The analog-to-digital converter circuit according to claim 1, comprising an amplifier circuit configured to amplify the residual voltage, wherein
    the fixed-quantity change time measurement converter circuit finely converts the residual voltage amplified by the amplifier circuit.

3. The analog-to-digital converter circuit according to claim 1, wherein
    the successive approximation converter circuit performs processing to give one redundant bit to the residual voltage, and
    the fixed-quantity change time measurement converter circuit finely converts the residual voltage subjected to the redundancy processing into a digital signal with the number of lower-order bits to which one bit is added.

4. The analog-to-digital converter circuit according to claim 2, wherein
    the successive approximation converter circuit performs processing to give one redundant bit to the residual voltage, and
    the fixed-quantity change time measurement converter circuit finely converts the residual voltage subjected to the redundancy processing into a digital signal with the number of lower-order bits to which one bit is added.

5. An analog-to-digital conversion method for converting an analog input signal voltage into a digital signal with a predetermined number of bits, comprising the steps of:
    sequentially comparing and coarsely converting the analog input signal voltage into a digital signal with a number of higher-order bits, and also outputting a residual voltage between the analog input signal voltage and an analog signal voltage corresponding to the digital signal with the number of higher-order bits;
    finely converting the residual voltage into a digital signal with a number of lower-order bits by changing the residual voltage at a fixed rate of change and by measuring the time until a predetermined value is reached; and
    generating a digital signal with the predetermined number of bits by combining the digital signal with the number of higher-order bits and the digital signal with the number of lower-order bits.

6. The analog-to-digital conversion method according to claim 5, further comprising amplifying the residual voltage, wherein
    the fine converting of the residual voltage finely converts the amplified residual voltage.

7. The analog-to-digital conversion method according to claim 5, wherein the coarse converting of the analog input signal voltage performs processing to give one redundant bit to the residual voltage, and the fine converting of the residual voltage finely converts the residual voltage subjected to the redundancy processing into a digital signal with the number of lower-order bits to which one bit is added.

8. The analog-to-digital conversion method according to claim 6, wherein the coarse converting of the analog input signal voltage performs processing to give one redundant bit to the residual, voltage, and the fine converting of the residual voltage finely converts the amplified residual voltage subjected to the redundancy processing into a digital signal with the number of lower-order bits to which one bit is added.

* * * * *

UNITED STATES PATENT AND TRADEMARK OFFICE
CERTIFICATE OF CORRECTION

PATENT NO. : 8,854,243 B2  
APPLICATION NO. : 13/869770  
DATED : October 7, 2014  
INVENTOR(S) : Masato Yoshioka Page 1 of 1

It is certified that error appears in the above-identified patent and that said Letters Patent is hereby corrected as shown below:

TITLE PAGE:

Item (71) Applicants should read: Fujitsu Limited, Kawasaki (JP); Fujitsu Semiconductor Limited, Yokohama (JP)

Signed and Sealed this  
Third Day of February, 2015

Michelle K. Lee  
*Deputy Director of the United States Patent and Trademark Office*